United States Patent
Cheng et al.

(10) Patent No.: US 9,472,558 B1
(45) Date of Patent: Oct. 18, 2016

(54) SEMICONDUCTOR STRUCTURES WITH STACKED NON-PLANAR FIELD EFFECT TRANSISTORS AND METHODS OF FORMING THE STRUCTURES

(71) Applicant: GLOBALFOUNDRIES INC., Grand Cayman, KY (US)

(72) Inventors: Kangguo Cheng, Schenectady, NY (US); Ali Khakifirooz, Los Altos, CA (US); Carl Radens, LaGangeville, NY (US); Robert C. Wong, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/940,499

(22) Filed: Nov. 13, 2015

(51) Int. Cl.
| | |
|---|---|
| H01L 21/8238 | (2006.01) |
| H01L 27/092 | (2006.01) |
| H01L 29/66 | (2006.01) |
| H01L 27/11 | (2006.01) |
| H01L 23/528 | (2006.01) |
| H01L 29/08 | (2006.01) |
| H01L 29/16 | (2006.01) |
| H01L 29/161 | (2006.01) |
| H01L 29/165 | (2006.01) |
| H01L 29/78 | (2006.01) |
| H01L 29/06 | (2006.01) |

(52) U.S. Cl.
CPC ... *H01L 27/1116* (2013.01); *H01L 21/823814* (2013.01); *H01L 21/823821* (2013.01); *H01L 21/823871* (2013.01); *H01L 21/823878* (2013.01); *H01L 23/5286* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/7848* (2013.01)

(58) Field of Classification Search
None
See application file for complete search history.

(56) References Cited

U.S. PATENT DOCUMENTS

| | | |
|---|---|---|
| 6,426,530 B1 | 7/2002 | Bertin et al. |
| 6,518,112 B2 | 2/2003 | Armacost et al. |

(Continued)

OTHER PUBLICATIONS

Ming-Long Fan; Hu, V.P.-H.; Yin-Nien Chen; Pin Su; Ching-Te Chuang, "Stability and Performance Optimization of Heterochannel Monolithic 3-D SRAM Cells Considering Interlayer Coupling" Electron Devices, IEEE Transactions on, Year: 2014, vol. 61, Issue: 10, pp. 3448-3455.

(Continued)

*Primary Examiner* — Khaja Ahmad
(74) *Attorney, Agent, or Firm* — Gibb & Riley, LLC; Anthony J. Canale

(57) ABSTRACT

Disclosed are semiconductor structures and methods of forming them. The structures include field effect transistors (FETs) with different type conductivities in different levels, respectively, of the same fin, wherein the numbers of FETs in the different levels are different. Specifically, in a fin, a first semiconductor layer has source/drain and channel regions for a first and a second transistor and a second semiconductor layer has source/drain and channel regions for a third transistor with a different type conductivity than first and second transistors. A gate is on the top surface and sides of the first semiconductor layer at the channel region of the first transistor. Another gate has a lower portion on the sides of the first semiconductor layer at the channel region of the second transistor and an upper portion on the top surface and sides of the second semiconductor layer at the channel region of the third transistor.

20 Claims, 18 Drawing Sheets

(56) References Cited

U.S. PATENT DOCUMENTS

| | | |
|---|---|---|
| 6,808,971 B2 | 10/2004 | Bhattacharyya |
| 7,098,477 B2 | 8/2006 | Zhu et al. |
| 7,368,788 B2 | 5/2008 | Huo et al. |
| 7,868,391 B2 | 1/2011 | Paone et al. |
| 7,964,916 B2 | 6/2011 | Or-Bach et al. |
| 8,581,320 B1* | 11/2013 | Cheng ............... H01L 21/84 257/309 |
| 8,680,623 B2 | 3/2014 | Frank et al. |
| 8,687,399 B2 | 4/2014 | Sekar et al. |
| 2013/0049136 A1* | 2/2013 | Wahl ............... H01L 21/82343 257/401 |

OTHER PUBLICATIONS

Xusheng Wu; Chan, Philip C.H.; Shengdong Zhang; Chuguang Feng; Chan, M., "A three-dimensional stacked fin-CMOS technology for high-density ULSI circuits", Electron Devices, IEEE Transactions onYear: 2005, vol. 52, Issue: 9, pp. 1998-2003.

* cited by examiner

SEMICONDUCTOR STRUCTURES WITH STACKED NON-PLANAR FIELD EFFECT TRANSISTORS AND METHODS OF FORMING THE STRUCTURES

FIELD OF THE INVENTION

The present invention relates to semiconductor structures and, more specifically, to semiconductor structures (e.g., static random access memory (SRAM) cells) with stacked non-planar multi-gate field effect transistor (MUGFETs) for increased device density and methods of forming the semiconductor structures.

BACKGROUND

Integrated circuit design decisions are often driven by semiconductor device scalability and semiconductor device density. For example, size scaling of single-gate planar field effect transistors (FETs) resulted in devices with smaller channel lengths. The smaller channel lengths, however, resulted in a corresponding increase in short channel effects and a decrease in drive current. In response, different types of non-planar multi-gate field effect transistors (MUGFETs), such as dual-gate non-planar FETs (also referred to herein as fin-type FETs (FINFETs)) and tri-gate non-planar FETs, that have one or more semiconductor fins were developed in order to provide reduced-size field effect transistors, while simultaneously avoiding corresponding increases in short channel effects and decreases in drive current. Various semiconductor structures incorporate multiple instances of non-planar MUGFETs having different type conductivities. For example, static random access memory (SRAM) cells are known that incorporate six non-planar MUGFETs: two N-type pass-gate transistors, two N-type pull-down transistors and two P-type pull-up transistors. While the use of non-planar MUGFETs, as opposed to planar FETs, has reduced the surface area of a chip consumed by such structures, further increasing device density is desirable.

SUMMARY

In view of the foregoing, disclosed herein are semiconductor structures. Each semiconductor structure can have non-planar multi-gate field effect transistors (MUGFETs) with different type conductivities in different levels, respectively, of the same multi-layered fin, wherein the number of MUGFETs in each level is different. Specifically, in each semiconductor structure, a fin can have two semiconductor layers and an isolation layer stacked between the semiconductor layers. The first semiconductor layer can have source, drain and channel regions for both a first transistor and a second transistor. The second semiconductor layer can have source, drain and channel regions for a third transistor, which has a different type of conductivity than the first and second transistors. A first gate can be adjacent to the top surface and opposing sides of the first semiconductor layer at the channel region of the first transistor. A second gate can have a lower portion adjacent to the opposing sides only of the first semiconductor layer at the channel region of the second transistor and an upper portion adjacent to the top surface and opposing sides of the second semiconductor layer at the channel region of the third transistor. One such semiconductor structure can be a static random access memory (SRAM) cell, wherein the first, second and third transistors are pass-gate, pull-down and pull-up transistors, respectively. Also disclosed herein are methods of forming the semiconductor structures.

More particularly, disclosed herein is a semiconductor structure having non-planar multi-gate field effect transistors (MUGFETs) with different type conductivities in different levels, respectively, of the same multi-layered fin, wherein the number of MUGFETs in each level is different.

The multi-layered fin can have a first semiconductor layer, an isolation layer on the first semiconductor layer and a second semiconductor layer on the isolation layer. The first semiconductor layer can be relatively long as compared to the isolation layer and the second semiconductor layer such that ends of the first semiconductor layer extend laterally beyond ends of the second semiconductor layer and the isolation layer.

The first semiconductor layer can have a first top surface and first opposing sides. Additionally, the first semiconductor layer can contain the active regions for multiple transistors having a first type conductivity. For example, for a first transistor, the first semiconductor layer can have at one end, which is not covered by the isolation layer and the second semiconductor layer, a first drain region, a first source region and a first channel region positioned laterally between the first drain region and the first source region. The first semiconductor layer can further have, for a second transistor, a second drain region positioned laterally adjacent to the first source region of the first transistor, a second source region and a second channel region positioned laterally between the second drain region and the second source region.

The isolation layer can be on the first top surface of the first semiconductor layer and, specifically, can be aligned above the second transistor (i.e., above the second drain region, the second channel region and the second source region).

The second semiconductor layer can be on the isolation layer and also aligned above the second transistor. The second semiconductor layer can have a second top surface and second opposing sides. The second semiconductor layer can further contain the active region(s) for a lesser number of transistors having a second type conductivity. For example, the second semiconductor layer can have, for a third transistor, a third drain region aligned above the second drain region, a third channel region aligned above the second channel region, and a third source region aligned above the second source region.

The semiconductor structure can further have multiple gates on the multi-layered fin. Specifically, the semiconductor structure can have a first gate adjacent to the first top surface and the first opposing sides of the first semiconductor layer at the first channel region. The semiconductor structure can also have a second gate with a lower portion adjacent to the first opposing sides only of the first semiconductor layer at the second channel region of the second transistor and an upper portion adjacent to the second top surface and second opposing sides of the second semiconductor layer at the third channel region of the third transistor.

One exemplary semiconductor structure that can incorporate the above-described configuration of non-planar MUGFETs is a static random access memory (SRAM) cell. In this case, the first, second and third transistors would be pass-gate, pull-down and pull-up transistors, respectively, on one side of the cell.

More specifically, also disclosed herein is a static random access memory (SRAM) cell. The SRAM cell can have two fin groups. Each fin group can be essentially identical in structure and can have at least one multi-layered fin that is configured as described above.

That is, the multi-layered fin in each fin group can have a first semiconductor layer, an isolation layer on the first semiconductor layer and a second semiconductor layer on the isolation layer. The first semiconductor layer can be relatively long as compared to the isolation layer and the second semiconductor layer such that ends of the first semiconductor layer extend laterally beyond ends of the second semiconductor layer and the isolation layer.

The first semiconductor layer can have a first top surface and first opposing sides. Additionally, the first semiconductor layer can contain the active regions for multiple transistors having N-type conductivity. For example, for pass-gate transistor, the first semiconductor layer can have at one end, which is not covered by the isolation layer and the second semiconductor layer, a first drain region, a first source region and a first channel region positioned laterally between the first drain region and the first source region. The first semiconductor layer can further have, for a pull-down transistor, a second drain region positioned laterally adjacent to the first source region of the pass-gate transistor, a second source region and a second channel region positioned laterally between the second drain region and the second source region.

The isolation layer can be on the first top surface of the first semiconductor layer and, specifically, can be aligned above the pull-down transistor (i.e., above the second drain region, the second channel region and the second source region). The second semiconductor layer can be on the isolation layer and also aligned above the pull-down transistor.

The second semiconductor layer can have a second top surface and second opposing sides. The second semiconductor layer can further contain the active region for another transistor having a P-type conductivity. For example, the second semiconductor layer can have, for a pull-up transistor, a third drain region aligned above the second drain region, a third channel region aligned above the second channel region, and a third source region aligned above the second source region.

Although each fin group is essentially identical in structure, the two fin groups can be oppositely oriented. That is, within the SRAM cell, one fin group can be positioned laterally adjacent and parallel to another fin group; however, the end portion of the fin that contains the active region of the pass-gate transistor in one fin group and the end portion of the fin that contains the active region of the pass-gate transistor in the other fin group will be on opposite sides of the SRAM cell.

The SRAM cell can further have first gates on the two fin groups, respectively. Each first gate can be adjacent to the first top surface and the first opposing sides of the first semiconductor layer at the first channel region of the pass-gate transistor. The SRAM cell can also have second gates on the two fin groups, respectively. The second gates can be in end-to-end alignment and each second gate can be adjacent to the first opposing sides of the first semiconductor layer at the second channel region of the pull-down transistor and adjacent to the second top surface and the second opposing sides of the second semiconductor layer at the third channel region of the pull-up transistor.

The SRAM cell can further have shared contacts on the two fin groups, respectively. Each shared contact can electrically connect the first source region of the pass-gate transistor and the second drain region of the pull-down transistor to the third drain region of the pull-up transistor, thereby forming a node.

The SRAM cell can further have local interconnects, wherein each local interconnect electrically connects a second gate on one fin group to a shared contact on another fin group.

Also disclosed herein is a method of forming a semiconductor having non-planar multi-gate field effect transistors (MUGFETs) with different type conductivities in different levels, respectively, of the same multi-layered fin, wherein the number of MUGFETs in each level is different. Specifically, in the method at least one multi-layered fin can be formed so as to have a first semiconductor layer, an isolation layer on the first semiconductor layer and a second semiconductor layer on the isolation layer. The first semiconductor layer can be relatively long as compared to the isolation layer and the second semiconductor layer such that end portions of the first semiconductor layer extend laterally beyond ends of the second semiconductor layer and the isolation layer. The first semiconductor layer can have a first top surface and first opposing sides. Additionally, the first semiconductor layer can contain the active regions for multiple transistors having a first type conductivity. For example, the first semiconductor layer can have, for a first transistor and within one end portion not covered by the isolation layer and the second semiconductor layer, a first drain region, a first source region and a first channel region positioned laterally between the first drain region and the first source region. The first semiconductor layer can further have, for a second transistor, a second drain region positioned laterally adjacent to the first source region of the first transistor, a second source region and a second channel region positioned laterally between the second drain region and the second source region. The isolation layer can be on the first top surface of the first semiconductor layer and, specifically, can be aligned above the second transistor (i.e., above the second drain region, the second channel region and the second source region). The second semiconductor layer can be on the isolation layer and also aligned above the second transistor. The second semiconductor layer can have a second top surface and second opposing sides. The second semiconductor layer can further contain the active region(s) for a lesser number of transistors having a second type conductivity. For example, the second semiconductor layer can have, for a third transistor, a third drain region aligned above the second drain region, a third channel region aligned above the second channel region, and a third source region aligned above the second source region.

In the method multiple gates can also be formed on the multi-layered fin. Specifically, at least a first gate and a second gate can be formed on the multi-layered fin. The first gate can be formed adjacent to the first top surface and the first opposing sides of the first semiconductor layer at the first channel region. The second gate can be formed with a lower portion adjacent to the first opposing sides only of the first semiconductor layer at the second channel region of the second transistor and an upper portion adjacent to the second top surface and second opposing sides of the second semiconductor layer at the third channel region of the third transistor.

The above-described method can, for example, be used to form a static random access memory (SRAM) cell. In this case, the first, second and third transistors would be pass-gate, pull-down and pull-up transistors, respectively, on one side of the cell.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, integrated circuit design decisions are often driven by semiconductor device scalability and semiconductor device density. For example, size scaling of single-gate planar field effect transistors (FETs) resulted in devices with smaller channel lengths. The smaller channel lengths, however, resulted in a corresponding increase in short channel effects and a decrease in drive current. In response, different types of non-planar multi-gate field effect transistors (MUGFETs), such as dual-gate non-planar FETs (also referred to herein as fin-type FETs (FINFETs)) and tri-gate non-planar FETs, that have one or more semiconductor fins were developed in order to provide reduced-size field effect transistors, while simultaneously avoiding corresponding increases in short channel effects and decreases in drive current. Various semiconductor structures incorporate multiple instances of non-planar MUGFETs having different type conductivities.

Figure 17:
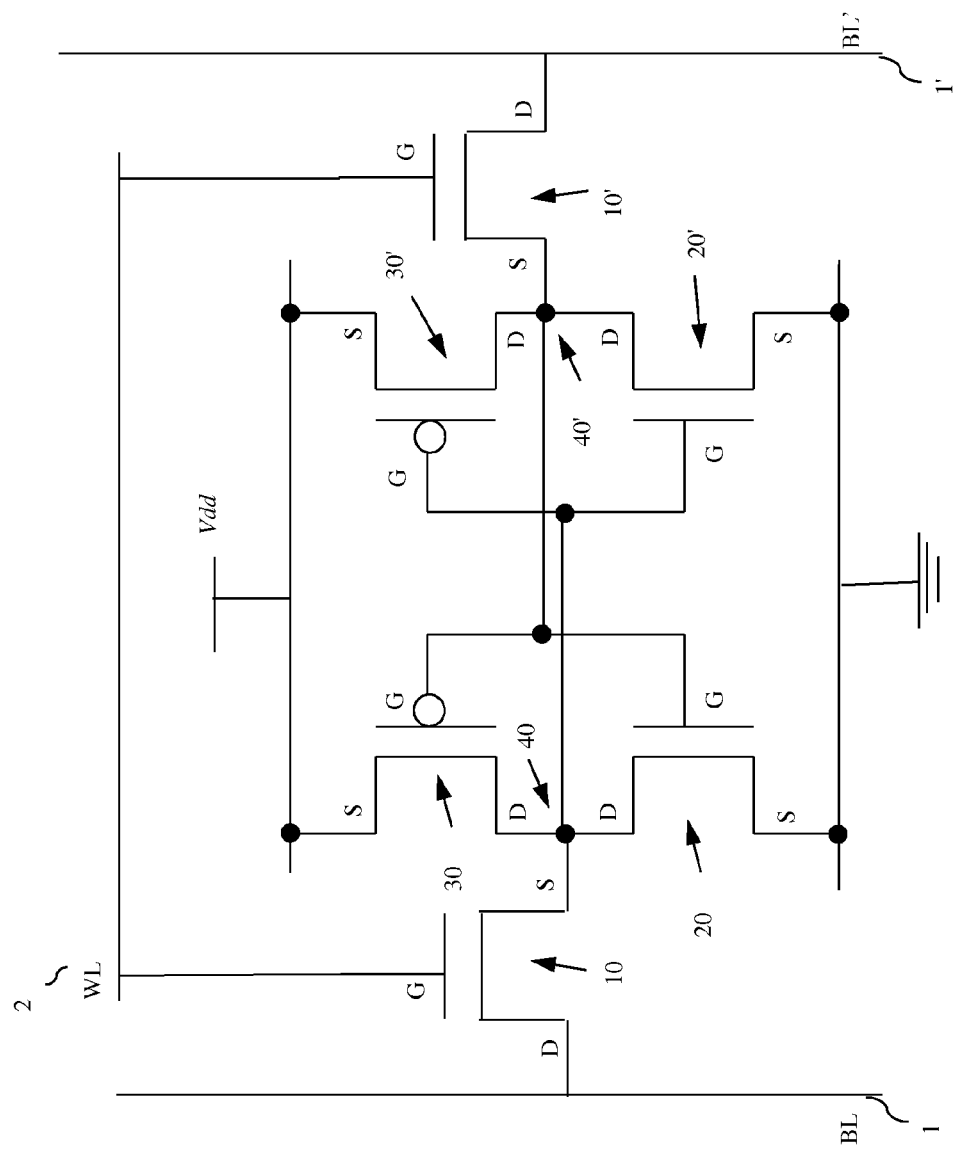
FIG. 17 is a schematic diagram illustrating an exemplary SRAM cell.
Figure 18:
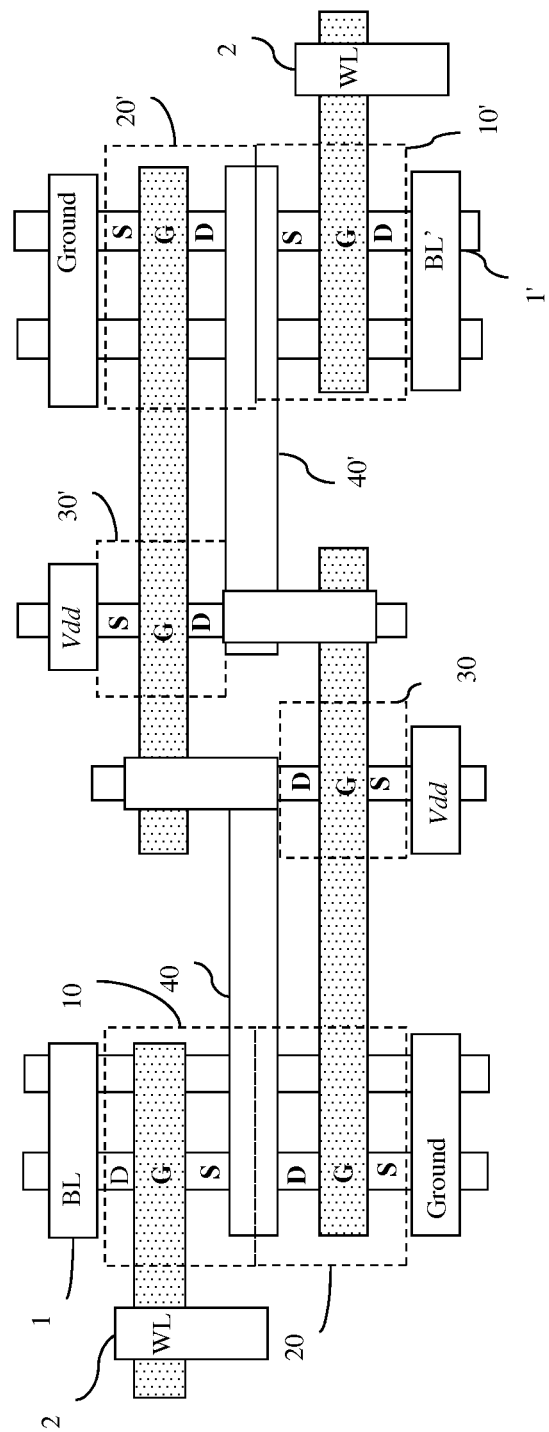
FIG. 18 is a top view diagram illustrating a conventional SRAM cell.

For example, static random access memory (SRAM) cells are known that incorporate six non-planar MUGFETs. FIG. 17 is a schematic diagram illustrating an exemplary six-transistor (6T) SRAM cell. FIG. 18 is a top view diagram illustrating an exemplary layout for a 6T SRAM cell that incorporates non-planar MUGFETs. Referring to FIGS. 17 and 18 in combination, as with 6T SRAM cells that incorporate planar FETs and a 6T SRAM cell that incorporates non-planar MUGFETs will have two N-type pass-gate transistors 10, 10', two N-type pull-down transistors 20, 20' and two P-type pull-up transistors 30, 30'. Specifically, such an SRAM cell will have a pair of N-type pass-gate transistors (also referred to as access transistors) 10, 10' and a pair of cross-coupled inverters. Each inverter has a P-type pull-up transistor 30, 30' connected in series to an N-type pull-down transistor 20, 20', respectively. A node 40 on a first side of the SRAM cell electrically connects the source of the pass-gate transistor 10, the drain (D) of the pull-down transistor 20 and the drain (D) of the pull-up transistor 30 to the gates (G) of the pull-up transistor 30' and pull-down transistor 20' a second side of the SRAM cell. Similarly, a node 40' on the second side of the SRAM cell electrically connects the source (S) of the pass-gate transistor 10', the drain (D) of the pull-down transistor 20' and the drain (D) of the pull-up transistor 30b to the gates (G) of the pull-up transistor 30 and pull-down transistor 20 on the first side of the SRAM cell. Furthermore, the drain (D) of the pass-gate transistor 10 is connected to one bitline (BL) 1 of a complementary pair of bitlines and the drain (D) of the pass-gate transistor 10' is connected another bitline (BL') 1' in the complementary pair of bitlines. The gates (G) of the pass-gate transistors 10, 10' are connected to a wordline (WL) 2. While the use of non-planar MUGFETs, as opposed to planar FETs, has reduced the surface area of a chip consumed by such structures, further increasing device density is desirable.

In view of the foregoing, disclosed herein are semiconductor structures. Each semiconductor structure can have non-planar multi-gate field effect transistors (MUGFETs) with different type conductivities in different levels, respectively, of the same multi-layered fin, wherein the number of MUGFETs in each level is different. Specifically, in each semiconductor structure, a multi-layered fin can have two semiconductor layers and an isolation layer stacked between the semiconductor layers. The first semiconductor layer can have source, drain and channel regions for both a first transistor and a second transistor. The second semiconductor layer can have source, drain and channel regions for a third transistor, which has a different type of conductivity than the first and second transistors. A first gate can be adjacent to the top surface and opposing sides of the first semiconductor layer at the channel region of the first transistor. A second gate can have a lower portion adjacent to the opposing sides only of the first semiconductor layer at the channel region of the second transistor and an upper portion adjacent to the top surface and opposing sides of the second semiconductor layer at the channel region of the third transistor. One such semiconductor structure can be a static random access memory (SRAM) cell, wherein the first, second and third transistors are pass-gate, pull-down and pull-up transistors, respectively. Also disclosed herein are methods of forming the semiconductor structures.

Figure 1:
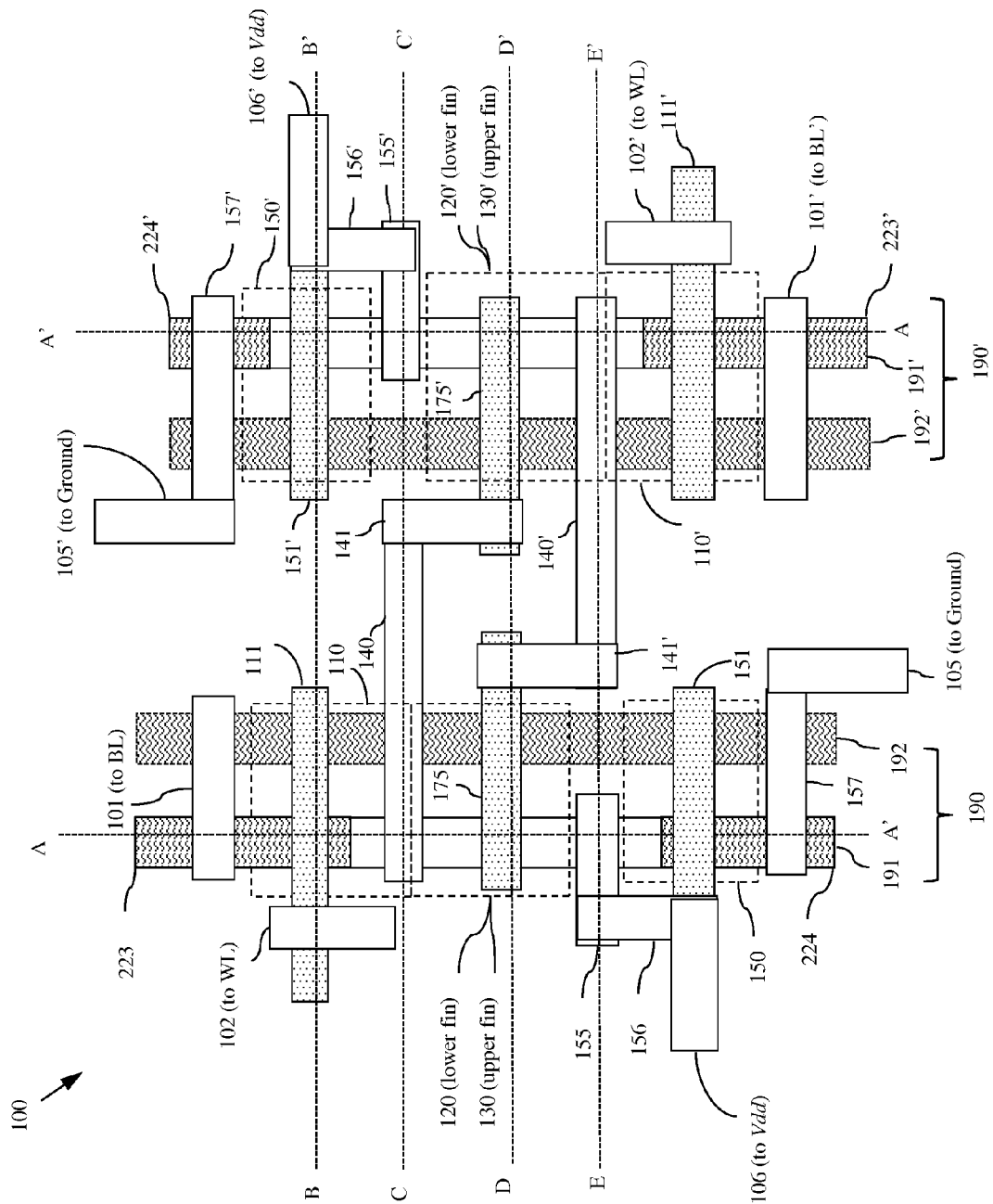
FIG. 1 a top view diagram illustrating a semiconductor structure (e.g., a static random access memory (SRAM) cell) having non-planar multi-gate field effect transistors (MUGFETs) with different type conductivities in different levels, respectively, of the same multi-layered fin.
Figure 2:
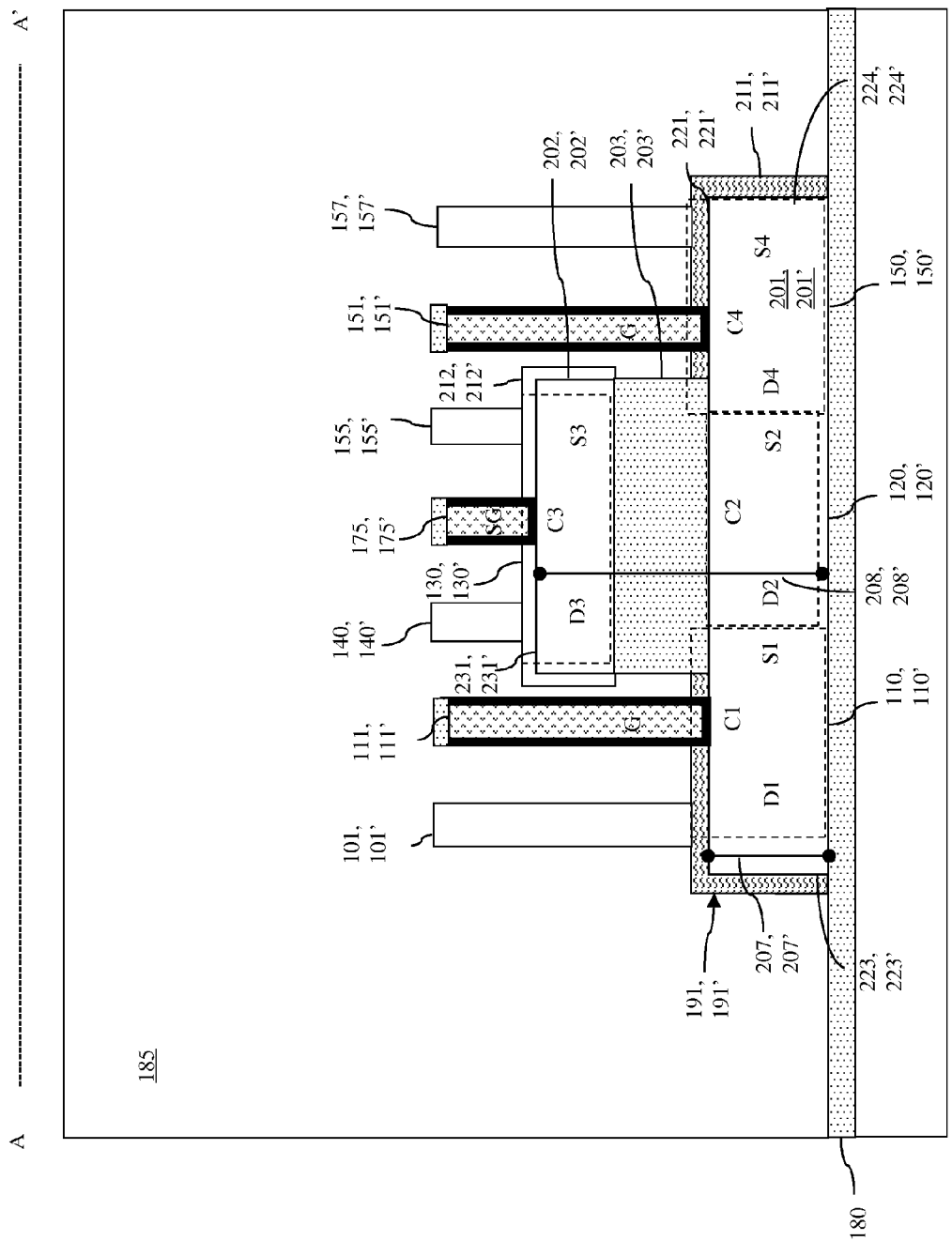
FIG. 2 a diagram illustrating the cross-section A-A' of the semiconductor structure of FIG. 1.
Figure 3:
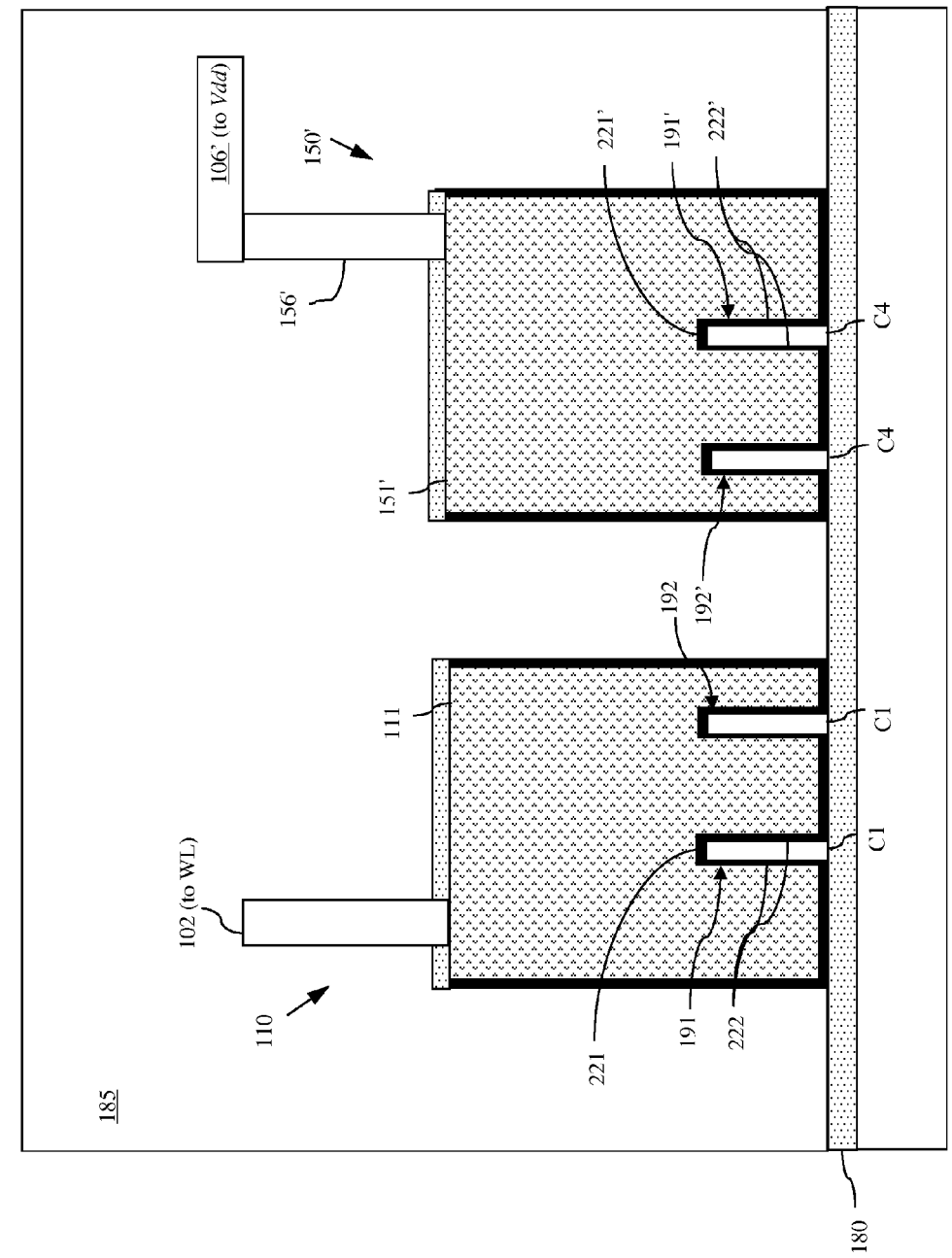
FIG. 3 a diagram illustrating the cross-section B-B' of the semiconductor structure of FIG. 1.
Figure 4:
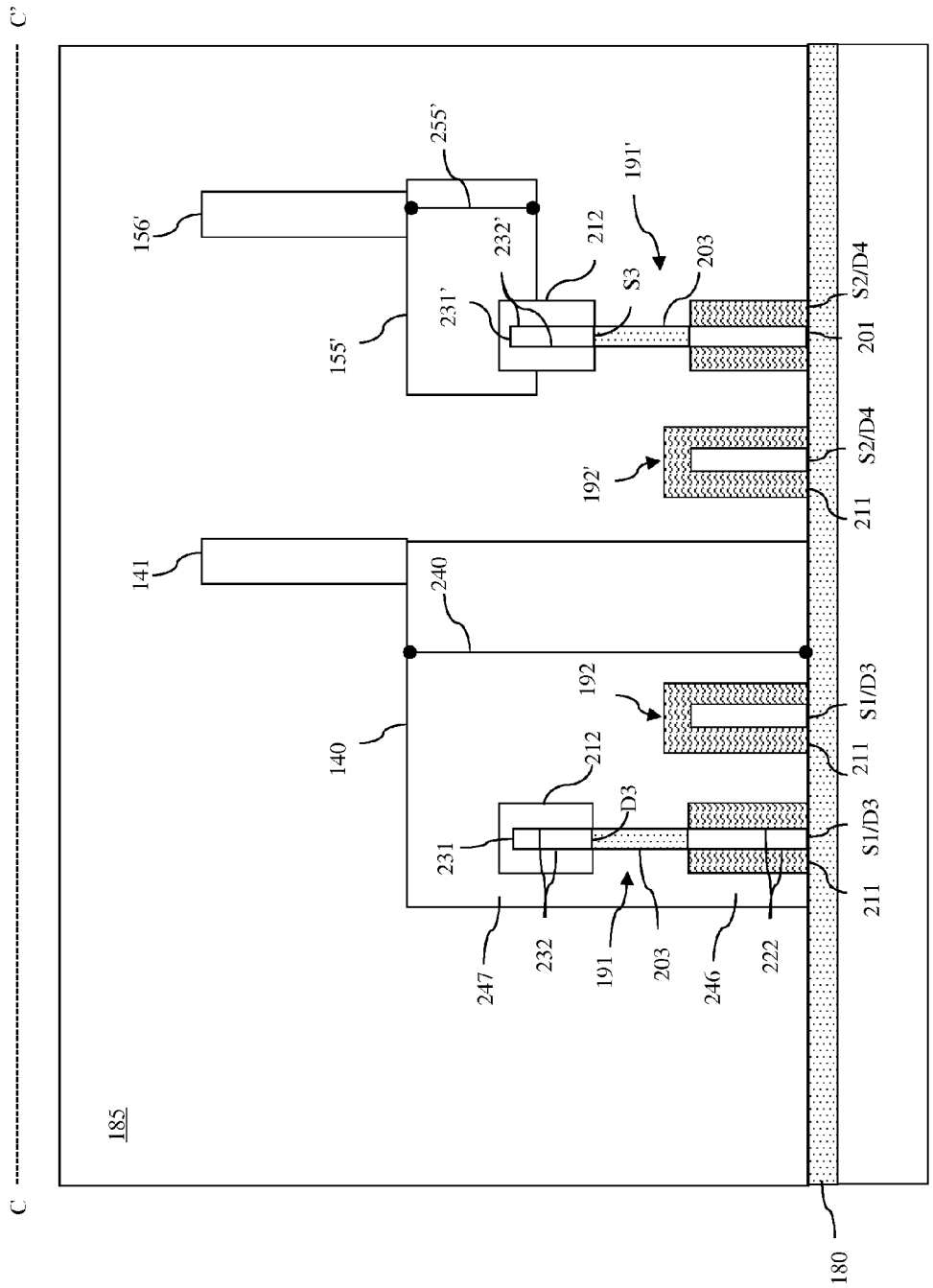
FIG. 4 a diagram illustrating the cross-section C-C' of the semiconductor structure of FIG. 1.
Figure 5:
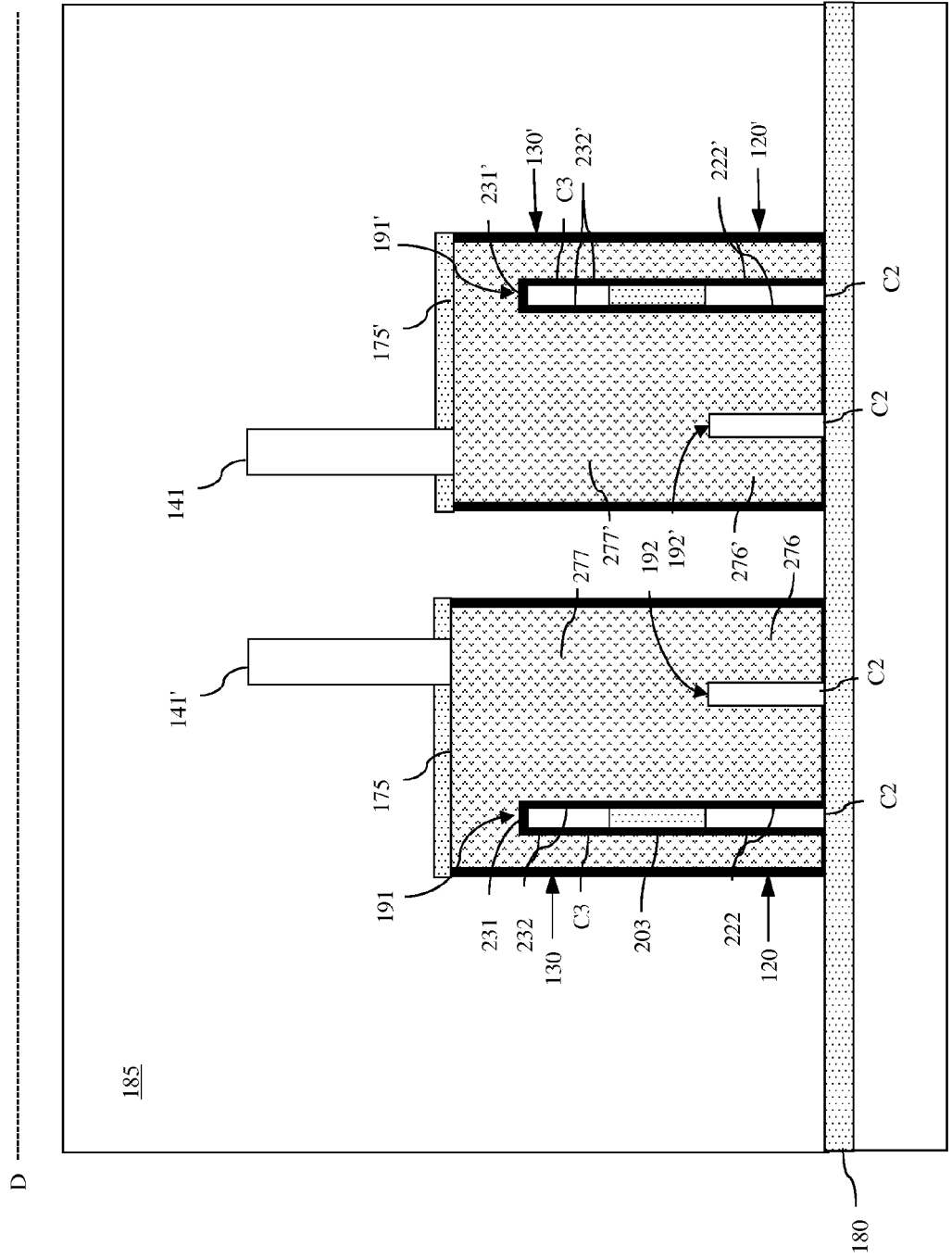
FIG. 5 a diagram illustrating the cross-section D-D' of the semiconductor structure of FIG. 1.
Figure 6:
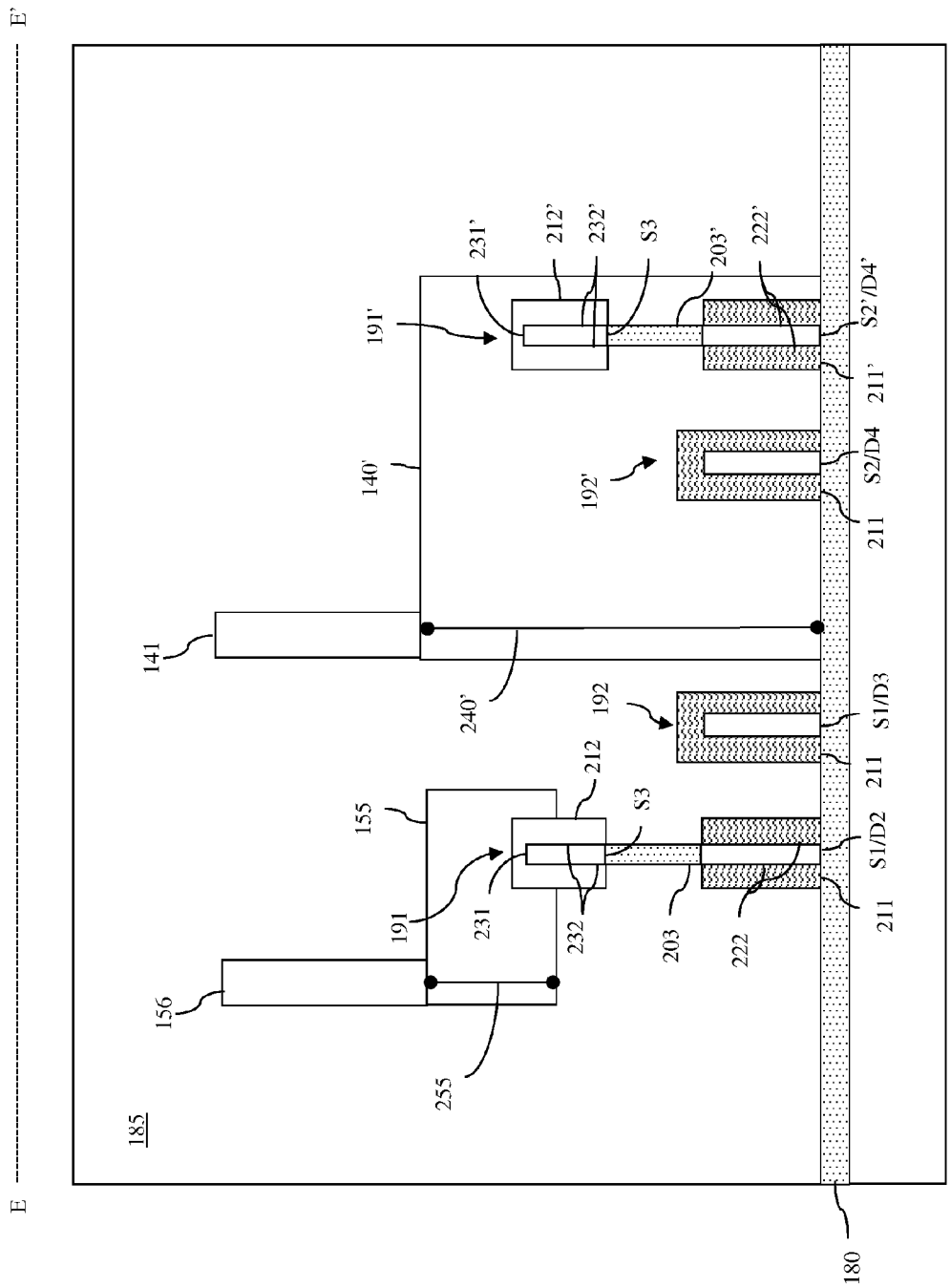
FIG. 6 a diagram illustrating the cross-section E-E' of the semiconductor structure of FIG. 1.

More particularly, referring to the top view diagram of FIG. 1 as well as the various cross-section diagrams of FIGS. 2-6, disclosed herein is a semiconductor structure 100 having non-planar multi-gate field effect transistors (MUG-FETs) with different type conductivities in different levels, respectively, of the same multi-layered fin, wherein the number of MUGFETs in each level is different. The semiconductor structure 100 can be, for example, a static random access memory (SRAM) cell or any other semiconductor structure that incorporates such a configuration of non-planar MUGFETs on the same multi-layered fin is a static random access memory (SRAM) cell. For purpose of illustration, the semiconductor structure 100 is described below and illustrated in the Figures as an SRAM cell having two tiered multi-layered fins 191, 191'.

Each multi-layered fin 191, 191' can be on the top surface of an insulator 180. The insulator 180 can, for example, be an insulator layer (e.g., a buried oxide BOX layer) of a semiconductor-on-insulator (SOI) wafer. Alternatively, the insulator 180 can be an isolation region (e.g., a dopant implant region), which isolates an upper portion of a bulk semiconductor substrate (e.g., a bulk silicon substrate) from a lower portion of the bulk semiconductor substrate.

Each multi-layered fin 191, 191' can have a first semiconductor layer 201, 201' immediately adjacent to the insulator 180, an isolation layer 203, 203' on the first semiconductor layer 201, 201' and a second semiconductor layer 202, 202' on the isolation layer 203, 203'. The first semiconductor layer 201, 201' and the second semiconductor layer 202, 202' can be the same monocrystalline semiconductor material. For example, the first semiconductor layer 201, 201' and the second semiconductor layer 202, 202' can be silicon. Alternatively, the first semiconductor layer 201, 201' and the second semiconductor layer 202, 202' can be different types of monocrystalline semiconductor materials (e.g., any of silicon, silicon germanium, silicon germanium carbide, silicon carbide, etc.). The choice of different semiconductor materials for the first semiconductor layer and the second semiconductor layer can be made so as to optimize the performance of FETs with different type conductivities at different levels of the same multi-layered fin. The isolation layer 203, 203' can be, for example, a silicon dioxide layer, a silicon nitride layer or a layer of any other suitable isolation material.

In any case, the first semiconductor layer 201, 201' can have a first top surface 221, 221', first opposing sides 222, 222' and first opposing ends (i.e., a first end 223, 223' and a second end 224, 224' opposite the first end). The first semiconductor layer 201, 201' can be relatively long as compared to both the isolation layer 203, 203' and the second semiconductor layer 202, 202' such that the ends (i.e., the first end 223, 223' and the second end 224, 224') of the first semiconductor layer 201, 201' extend laterally beyond ends of the second semiconductor layer 202, 202' and the isolation layer 203, 203'. Thus, each multi-layered fin 191, 191' is a tiered multi-layered fin structure that has end sections, which have a first height 207, 207', and a center section, which is positioned laterally between the end sections and which has a second height 208, 208' that is greater than the first height 207, 207'. As mentioned above, in the case of an SRAM cell, the fin groups 190 and 190' are oppositely oriented. Thus, the first end 223 of the first semiconductor layer 201 of the multi-layered fin 191 and the second end 224' of the first semiconductor layer 201' of the multi-layered fin 191' are on the same side of the SRAM cell (e.g., see top of FIG. 1) and the first end 223' of the first semiconductor layer 201' of the multi-layered fin 191' and the second end 224 of the first semiconductor layer 191 of the multi-layered fin 191 are on the same side of the SRAM cell (e.g., see bottom of FIG. 1).

Additionally, the first semiconductor layer 201, 201' can contain the active regions for multiple transistors having a first type conductivity (e.g., for multiple N-type field effect transistors (NFETs)). For example, for a first transistor 110, 110' (e.g., an N-type pass-gate transistor), the first semiconductor layer 201, 201' can have a first drain region (D1), a first source region (Si) and a first channel region (C1) positioned laterally between the first drain region (D1) and the first source region (S1). The first drain region (D1), first channel region (C1) and first source region (S1) can all be within the first end 223, 223' portion of the first semiconductor layer 201, 201', which is not covered by the isolation layer 203, 203' and the second semiconductor layer 202, 202', and the first drain region (D1) can the outermost region at that first end 223, 223'. The first semiconductor layer 201, 201' can further have, for a second transistor 120, 120' (e.g., an N-type pull-down transistor), a second drain region (D2) positioned laterally adjacent to the first source region (S1) of the first transistor 110, 110', a second source region (S2) and a second channel region (C2) positioned laterally between the second drain region (D2) and the second source region (S2).

The isolation layer 203, 203' can be on the first top surface 221, 221' of the first semiconductor layer 201, 201' and, specifically, can be aligned above the second transistor 120, 120' (i.e., above the second drain region (D2), the second channel region (C2) and the second source region (S2)).

The second semiconductor layer 202, 202' can be on the isolation layer 203, 203' and also aligned above the second transistor 120, 120'. The second semiconductor layer 202, 202' can have a second top surface 231, 231' and second opposing sides 232, 232'. The second semiconductor layer 202, 202' can further contain the active region(s) for a lesser number of transistors having a second type conductivity (e.g., for P-type field effect transistor(s) (PFET(s)). For example, the second semiconductor layer 202 can have, for a third transistor 130, 130' (e.g., a P-type pull-up transistor), a third drain region (D3) aligned above the second drain region (D2) of the second transistor 120, 120', a third channel region (C3) aligned above the second channel region (C2) of the second transistor 120, 120', and a third source region (S3) aligned above the second source region (S2) of the second transistor 120, 120'.

The first semiconductor layer 201, 201' can further contain the active region for a fourth transistor 150, 150' having the same first type conductivity (e.g., N-type conductivity) as the first transistor 110, 110' and the second transistor 120, 120'. For example, for a fourth transistor 150, 150' (e.g., an N-type footer transistor), the first semiconductor layer 201, 201' can have a fourth drain region (D4) positioned, for example, immediately adjacent to the second source region (S2) of the second transistor 120, 120', a fourth drain region (S4) and a fourth channel region (C4) positioned laterally between the fourth drain region (D4) and the fourth source region (S4). The fourth drain region (D4), the fourth channel region (C4) and the fourth source region (S4) can all be within in the second end 224, 224' portion of the first semiconductor layer 201, 201', which is not covered by the isolation layer 203, 203' and the second semiconductor layer 202, 202', and the fourth source region (S4) can be the outermost region at that second end 224, 224'.

Optionally, each multi-layered fin 191, 191' can have a first epitaxial source/drain layer 211, 211' adjacent to the first semiconductor layer 201, 201' at each of the source/drain regions contained within that layer 201, 201'. Specifically, the first epitaxial source/drain layer 211, 211' can be on the first opposing sides 222, 222' and first top surface 221, 221' of the first semiconductor layer 201, 201' at the first drain region (D1) and first source region (S1) of the first transistor 110, 110', on the first opposing sides 222, 222' only of the first semiconductor layer 201, 201' at the second drain region (D2) and second source region (S2) of the second transistor 120, 120' and on the first top surface 221, 221' and first opposing sides 222, 222' of the first semiconductor layer 201, 201' at the fourth drain region (D4) and fourth source region (S4) of the fourth transistor 150, 150'.

Optionally, each multi-layered fin 191, 191' can also have a second epitaxial source/drain layer 212, 212', which is different from the first epitaxial source/drain layer 211, 211', adjacent to the second semiconductor layer 202, 202' at each of the source/drain regions contained within that layer 202, 202'. Specifically, the second epitaxial source/drain layer 211, 211' can be on the second top surface 231, 231' and second opposing sides 232, 232' of the second semiconductor layer 202, 202' at the second source region (S2) and the second drain region (D2) of the second transistor 120, 120'.

The first epitaxial source/drain layer 211, 211' and the second epitaxial source/drain layer 212, 212' can be the same semiconductor material (e.g., silicon). Alternatively, the first epitaxial source/drain layer 211, 211' and the second epitaxial source/drain layer 212, 212' can be different types of semiconductor materials, which are optimal for performance given the different type conductivities. For example, if the active regions in the first semiconductor layer 201, 201' are for NFETs, the first epitaxial source/drain layer 211, 211' on the first semiconductor layer 201, 201' can be a silicon carbide layer, whereas if the active region(s) in the second semiconductor layer 202, 202' are for PFET(s), then the second epitaxial source/drain layer 212, 212' on the second semiconductor layer 202, 202' can be a silicon germanium layer.

The semiconductor structure 100 can further have multiple gates (e.g., see gates 111, 175, and 151) on each multi-layered fin 191, 191'. The gates can be any suitable gate structure that includes a gate dielectric layer immediately adjacent to at least one channel region and a gate conductor layer on the gate dielectric layer. Such gate structures can include, but are not limited to, gate-first structures (e.g., polysilicon gate structures) and gate-last structures (e.g., replacement metal gate structures). Such gate structures are well known in the art and, thus, the details of such gates structures are omitted from this specification in order to allow the reader to focus on the salient aspects of the disclosed semiconductor structure 100. Specifically, the multiple gates on each multi-layered fin 191, 191' can include a first gate 111, 111' for the first transistor 110, 110', which, as discussed above, has its active region in near the first end 223, 223' of the first semiconductor layer 201, 201'. This first gate 111, 111' can be positioned adjacent to the first top surface 221, 221' and the first opposing sides 222, 222' of the first semiconductor layer 201, 201' at the first channel region (C1). The multiple gates on each multi-layered fin 191, 191' can also include a second gate 175, 175' and, particularly, a shared gate (SG) for the second transistor 120, 120' and the third transistor 130, 130', which, as discussed above, have their active regions in the first and second semiconductor layers, respectively, in the center section of the multi-layered fin 191, 191'. The second gate 175, 175' can have a lower portion 276, 276' adjacent to the first opposing sides 222, 222' only of the first semiconductor layer 201, 201' at the second channel region (C2) of the second transistor 120, 120' and an upper portion 277, 277' adjacent to the second top surface 231, 231' and the second opposing sides 232, 232' of the second semiconductor layer 202, 202' at the third channel region (C3) of the third transistor 130, 130'. The multiple gates on each multi-layered fin 191, 191' can also include a third gate 151, 151' for the fourth transistor 150, 150', which, as discussed above, has its active region near the second end 224, 224' of the first semiconductor layer 201, 201'. The third gate 151, 151' can be positioned adjacent to the first top surface 221, 221' and the first opposing sides 222, 222' of the first semiconductor layer 201, 201' at the fourth channel region (C4).

The semiconductor structure 100 can further be covered by one or more layers of interlayer dielectric (ILD) material 185. The ILD material 185 can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

The semiconductor structure 100 can have multiple contacts (e.g., see contacts 101, 101'; 140, 140'; 155, 155'; and 157, 157') that extend vertically through the ILD material 185 to the multi-layered fin 191, 191'. The multiple contacts can include a first contact 101, 101' to the first drain region (D1) of the first transistor 110, 110'. In the case of an SRAM cell, the first contact 101 can be electrically connected to one bitline (BL) of a complementary pair of bitlines and the first contact 101' can be electrically connected to another bitline (BL') of the complementary pair of bitlines. The multiple contacts on each multi-layered fin 191, 191' can also include a second contact 140, 140' and, particularly, a shared contact for the first source region (S1) of the first transistor 110, 110', the second drain region (D2) of the second transistor 120, 120' and the third drain region (D3) of the third transistor 130, 130'. This second contact 140, 140' can have a lower portion 246, 246' adjacent to the first opposing sides 222, 222' only of the first semiconductor layer 201, 201' at the interface between the first source region (S1) of the first transistor 110, 110' and the second drain region (D2) of the second transistor 120, 120' and an upper portion 247, 247' adjacent to the second top surface 231, 231' and the second opposing sides 232, 232' of the second semiconductor layer 202, 202' at the third drain region (D3) of the third transistor 130, 130'. The multiple contacts on each multi-layered fin 191, 191' can also include a third contact 155, 155' to the third drain region (D3) of the third transistor 130, 130' and a fourth contact 157, 157' to the fourth source region (S4) of the fourth transistor 150, 150'.

It should be noted that this third contact 155, 155' shall not be a shared contact and, specifically, shall not also extend to the second drain region (D2) of the second transistor 120, 120' below. Thus, for example, the top surfaces of the contacts and, particularly, the second contact 140, 140' and the third contact 155, 155' can be essentially coplanar, but the third contact 155, 155' can relatively shallow. That is, the second contact 140, 140' and the third contact 155, 155' can have different heights 240, 240' and 255, 255', respectively (see FIGS. 4 and 6) such that the second contact 140, 140' extends below the level of the top surface 221, 221' of the first semiconductor layer 201, 201' (e.g., to the top surface of the insulator 180) and is electrically connected to the first semiconductor layer 201, 201', whereas the third contact 155, 155' does not extend below the level of the top surface 221, 221' of the first semiconductor layer 201, 201' and is electrically isolated from the first semiconductor layer 201, 201'.

Optionally, each fin group 190, 190' can further include at least one second fin 192, 192' parallel to the multi-layered fin 191, 191'. Each second fin 192, 192' can be a single-layer fin and, particularly, can be a single semiconductor layer. The single semiconductor layer can be made up of the same semiconductor material as the first semiconductor layer 201, 201' and can have the same height as the first semiconductor layer 201, 201' such that the height of the second fin 192, 192' will be relatively short as compared to the overall height of the multi-layered fin 191, 191'.

The addition of second fin(s) into the structure allows for SRAM cell configurations where one or more of the different N-type non-planar MUGFETs (e.g., the pull-down MUGFETs 120, 120' and/or the pass-gate MUGFETs 110, 110') incorporate multiple channel regions. For example, the following x:y:z configurations could be formed (where the x refers to the number of discrete channel regions incorporated into the pull-up MUGFETs, y refers to the number of discrete channel regions incorporated into the pass-gate MUGFETs and z refers to the number of discrete channel regions incorporated into the pull-down MUGFETs): (a) 1:1:1, which incorporates no second fins; (b) 1:1:2, which incorporates a second fin that contains an active region for the second transistor 120, 120' and, optionally, the fourth transistor 150, 150', but not the first transistor 110, 110'; (c) 1:2:2, which incorporates a second fin that contains active regions for the first transistor 110, 110' and the second transistor 120, 120' and, optionally, the fourth transistor 150, 150'; (d) 1:1:3, which incorporates two second fins that each contain active regions for the second transistor 120, 120' and, optionally, the fourth transistor 150, 150', but not the first transistor 110, 110'; etc. For purposes of illustration, a 1:2:2 configuration, where a second fin 192, 192' has an active region for the second transistor 120, 120', for the first transistor 110, 110' and the fourth transistor 150, 150', is shown in the Figures. It should be understood that the Figures are not intended to be limiting and, alternatively, any other configuration could be used.

Optionally, the top surface and opposing sides of each second fin 192, 192' at the source and drain regions of any active regions contained therein can also be covered by the first epitaxial source/drain layer 211, 211'. Additionally, it should be noted that, when each fin group 190, 190' has a second fin 192, 192' (or as discussed above, multiple second fins), one or more of the gates on the multi-layered fin 191, 191' can extend laterally over the second fin(s) 192, 192' in the same fin group, depending upon the desired configuration. For example, with the 1:2:2 configuration illustrated in the Figures, the first gate 111, 111' can extend laterally over the second fin 192, 192' such that it is adjacent to an additional first channel region for the first transistor 110, 110'. The second gate 175, 175' (i.e., the shared gate) can extend laterally over the second fin 192, 192' such that it is adjacent to an additional second channel region for the second transistor 120, 120'. The third gate 151, 151' can extend laterally over the second fin 192, 192' such that it is adjacent to an additional fourth channel region for the fourth transistor 150, 150'. Those skilled in the art will recognize that incorporation of the second fin(s) 192, 192' and, particularly, the additional channel regions for any of the N-type transistors including the first transistor 110, 110' (e.g., the pass-gate transistor), the second transistor 120, 120' (e.g., the pull-up transistor) and/or the fourth transistor 150, 150' (e.g., the footer), effectively increases the drive current. Furthermore, when each fin group 190, 190' has the second fin(s) 192, 192', some, but not all, of the contacts on the multi-layered fin 191, 191' can extend laterally over the second fin(s) 192, 192' in the same fin group. For example, in the 1:2:2 configuration shown, the first contact 101, 101' can extend laterally over the second fin 192, 192' such that it is adjacent to an additional first drain region of the first transistor 110, 110'. The second contact 140, 140' can extend laterally over the second fin 192, 192' such that it is adjacent to an interface between an additional source region of the first transistor 110, 110' and an additional drain region of the second transistor 120, 120'. The fourth contact 157, 157' can extend laterally over the second fin 192, 192' such that it is adjacent to an additional fourth source region of the fourth transistor 150, 150'. However, since the second fin 192, 192' does not contain an additional active region for the third transistor 130, 130', the third contact 155, 155' does not extend laterally over the second fin 192, 192' and instead is electrically isolated from the second fin 192, 192' by the ILD material 185.

The semiconductor structure 100 can further have various local interconnects extending horizontally through the ILD material 185 and electrically connecting one or more of the structure components described above. For example, in the case of an SRAM cell, a local interconnect 102, 102' can electrically connect the first gate 111, 111' of the first transistor 110, 110' (e.g., the N-type pass-gate transistor) to a wordline (WL). Additionally, a local interconnect 141 can electrically connect the second contact 140 (i.e., the shared contact) on the first fin group 190 to the second gate 175' (i.e., the shared gate) on the second fin group 190' and another local interconnect 141' can electrically connect the second contact 140' (i.e., the shared contact) on the second fin group 190' to the second gate 175 (i.e., the shared gate) on the first fin group 190, thereby forming the cross-coupled inverters of the SRAM cell. Another local interconnect 156, 156' can electrically connect the third contact 155, 155' to the third gate 151, 151' of the fourth transistor 150, 150'.

Since, as described above, the first transistor 110, 110', the second transistor 120, 120' and the fourth transistor 150, 150' in the lower level (i.e., the first semiconductor layer 201, 201') of the semiconductor structure 100 have the first type conductivity and are specifically described above as being NFETs, the fourth contact 157, 157' to the fourth source region (S4) of the fourth transistor 150, 150' (e.g., the footer transistor) at the second end 224, 224' of the first semiconductor layer 201, 201' can be electrically connected by an additional interconnect 105, 105' to ground. Additionally, since the third transistor 130, 130' in the upper level (i.e., the second semiconductor layer 202, 202') of the semiconductors structure 100 has a second type conductivity and is specifically described above as being a PFET, the local interconnect 156, 156' that electrically connects the third contact 155, 155' to the third gate 151, 151' of the fourth transistor 150, 150' can be electrically connected by another additional interconnect 106, 106' to a positive power supply (e.g., Vdd).

Figure 7:
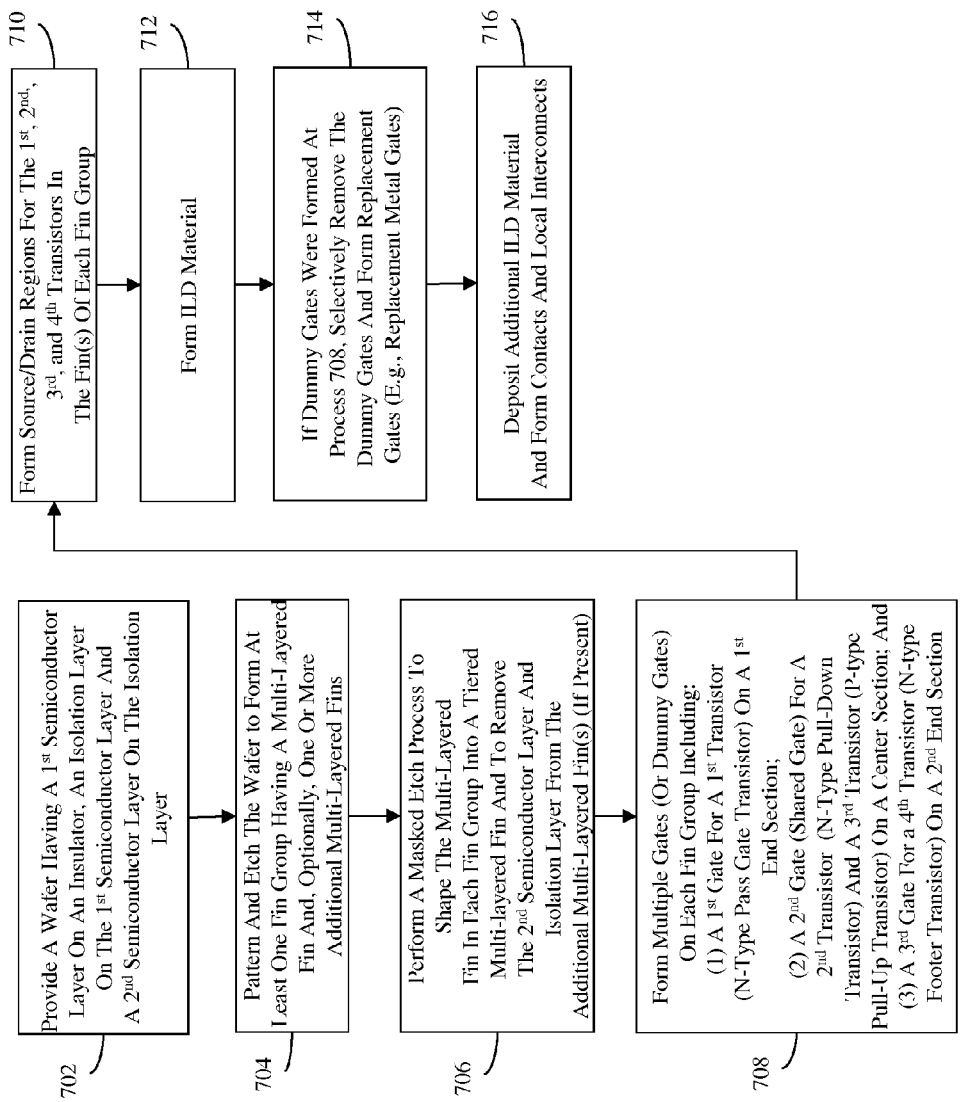
FIG. 7 is a flow diagram illustrating a method of the semiconductor structure (e.g., the static random access memory (SRAM) cell) of FIG. 1.

Referring to the flow diagram of FIG. 7, also disclosed herein is a method of forming a semiconductor structure 100, as described above, having non-planar multi-gate field effect transistors (MUGFETs) with different type conductivities in different levels, respectively, of the same multi-layered fin, wherein the number of MUGFETs in each level is different. As mentioned above, the semiconductor structure 100 can be, for example, a static random access memory (SRAM) cell or any other semiconductor structure that incorporates such a configuration of non-planar MUGFETs on the same multi-layered fin is a static random access memory (SRAM) cell. For purpose of illustration, the method is described below and illustrated in the Figures with respect to the formation of an SRAM cell that incorporates a pair of fin groups that are parallel to each other and essentially identical in structure, but oppositely oriented. The pair of fin groups includes a first fin group 190 with a multi-layered fin 191 and, optionally, one or more second fin(s) 192 on one side of the SRAM cell and a second fin group 190' with another multi-layered fin 191' and, optionally, one or more second fin(s) 192' on the opposite side of the SRAM cell.

Figure 8:
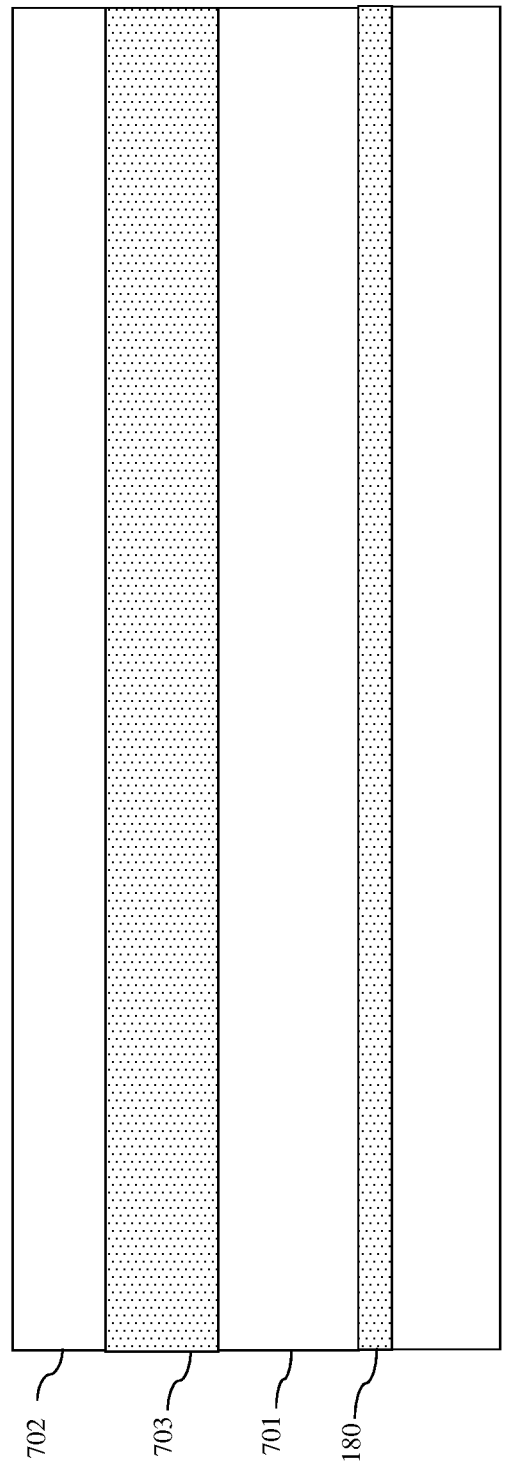
FIG. 8 is a cross-section diagram illustrating a partially completed semiconductor structure formed according to the method of FIG. 7.

The method can begin with a wafer having a first semiconductor layer 801 on an insulator 180, an isolation layer 803 on the first semiconductor layer 801 and a second semiconductor layer 802 on the isolation layer (702, see FIG. 8). The first semiconductor layer 801 and insulator 180 can, for example, be the monocrystalline semiconductor layer (e.g. silicon layer, silicon carbine layer, etc.) and insulator layer (e.g., a buried oxide BOX layer) of a semiconductor-on-insulator (SOI) wafer. Alternatively, the semiconductor layer can be an upper portion of a bulk monocrystalline semiconductor substrate (e.g., a bulk silicon substrate) and the insulator 180 can be isolation region (e.g., a dopant implant region) that isolates the upper portion of the bulk semiconductor substrate from the lower portion. The isolation layer 803 can be, for example, a silicon dioxide layer, a silicon nitride layer or a layer of any other suitable isolation material. The second semiconductor layer 802 can be another monocrystalline semiconductor layer (e.g., a silicon layer, a silicon germanium layer, etc.). The choice of different semiconductor materials for the first semiconductor layer and the second semiconductor layer can be made so as to optimize the performance of FETs with different type conductivities at different levels of the same multi-layered fin. Techniques, such as Smart Cut, for forming a monocrystalline semiconductor layer on an isolation layer are well known in the art and, thus, the details of such techniques are omitted from this specification in order to allow the reader to focus on the salient aspects of the disclosed method.

As discussed in greater detail below, during subsequent process, active regions for transistors having a first type conductivity (e.g., N-type transistors) will be formed in the first semiconductor layer and active region(s) for transistor(s) having a second type conductivity (e.g., P-type transistors) will be formed in the second semiconductor layer. Thus, the first semiconductor layer can be formed on the wafer so as to have the second type conductivity at a relatively low conductivity level (e.g., a P− conductivity) and the second semiconductor layer can be formed on the wafer so as to have the first type conductivity at a relative low conductivity level (e.g., N− conductivity).

Figure 9:
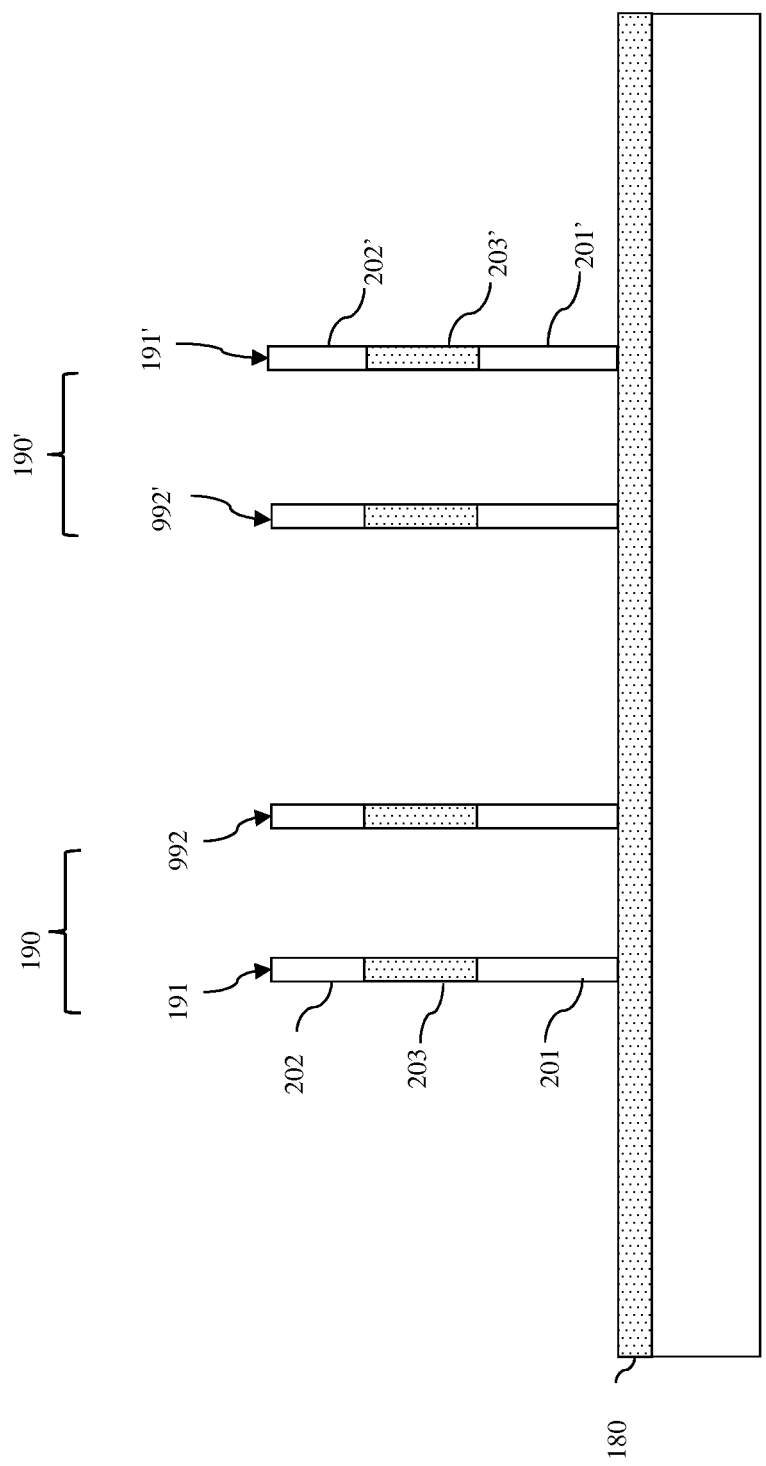
FIG. 9 is a cross-section diagram illustrating a partially completed semiconductor structure formed according to the method of FIG. 7.

Next, the wafer can be patterned and etch to form at least one fin group with a multi-layered fin and, optionally, an additional multi-layered fin (704, see FIG. 9). For example, for an SRAM cell, the wafer can be patterned and etched to form two fin groups 190, 190', each fin group 190, 190' having a multi-layered fin 191, 191' and, optionally, one or more additional multi-layered fins 992, 992'. As a result of this process 704, each multi-layered fin 191, 191' will have a first semiconductor layer 201, 201' immediately adjacent to the insulator 180, an isolation layer 203, 203' on the first semiconductor layer 201, 201' and a second semiconductor layer 202, 202' on the isolation layer 203, 203'. Each additional multi-layered fin 992, 992' will be essentially identical the multi-layered fin 191, 191'. Techniques, such as sidewall image transfer (SIT), for forming fins are well known in the art and, thus, the details of such techniques are omitted from this specification in order to allow the reader to focus on the salient aspects of the disclosed method.

Figure 10:
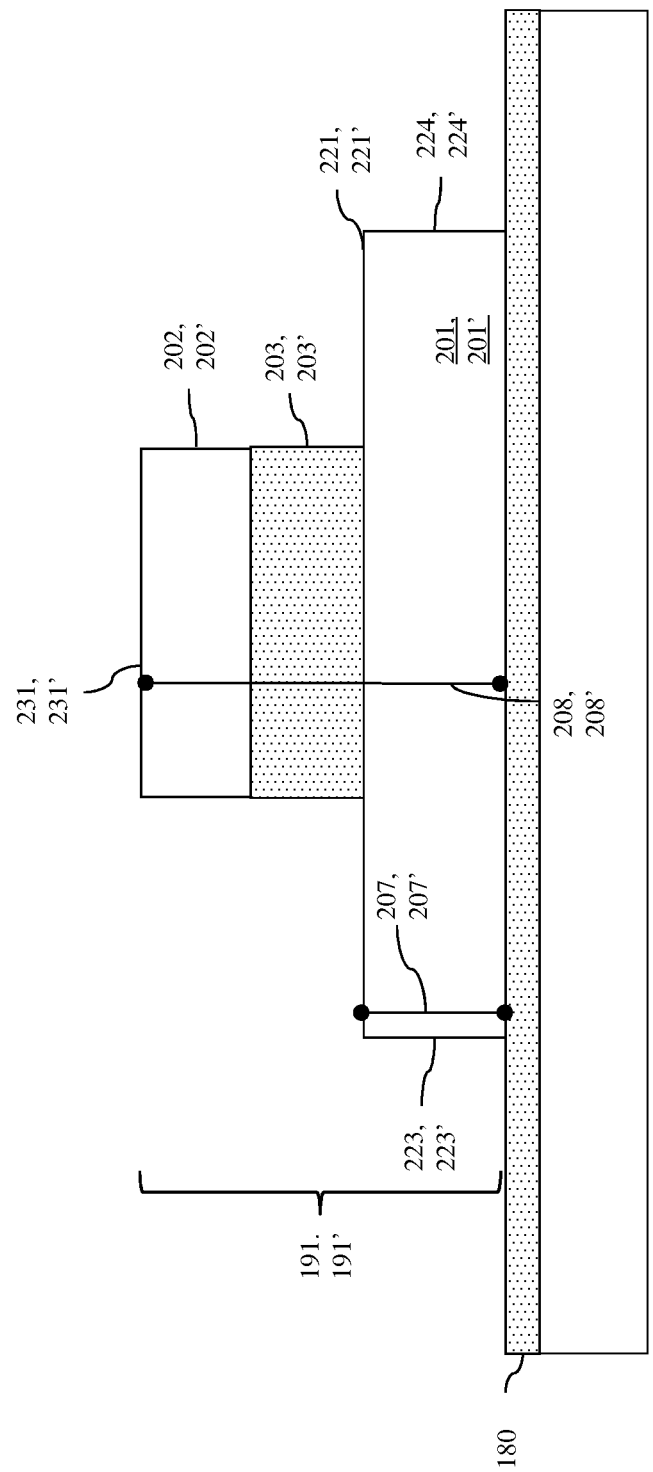
FIG. 10 is a cross-section diagram illustrating a partially completed semiconductor structure formed according to the method of FIG. 7.
Figure 11:
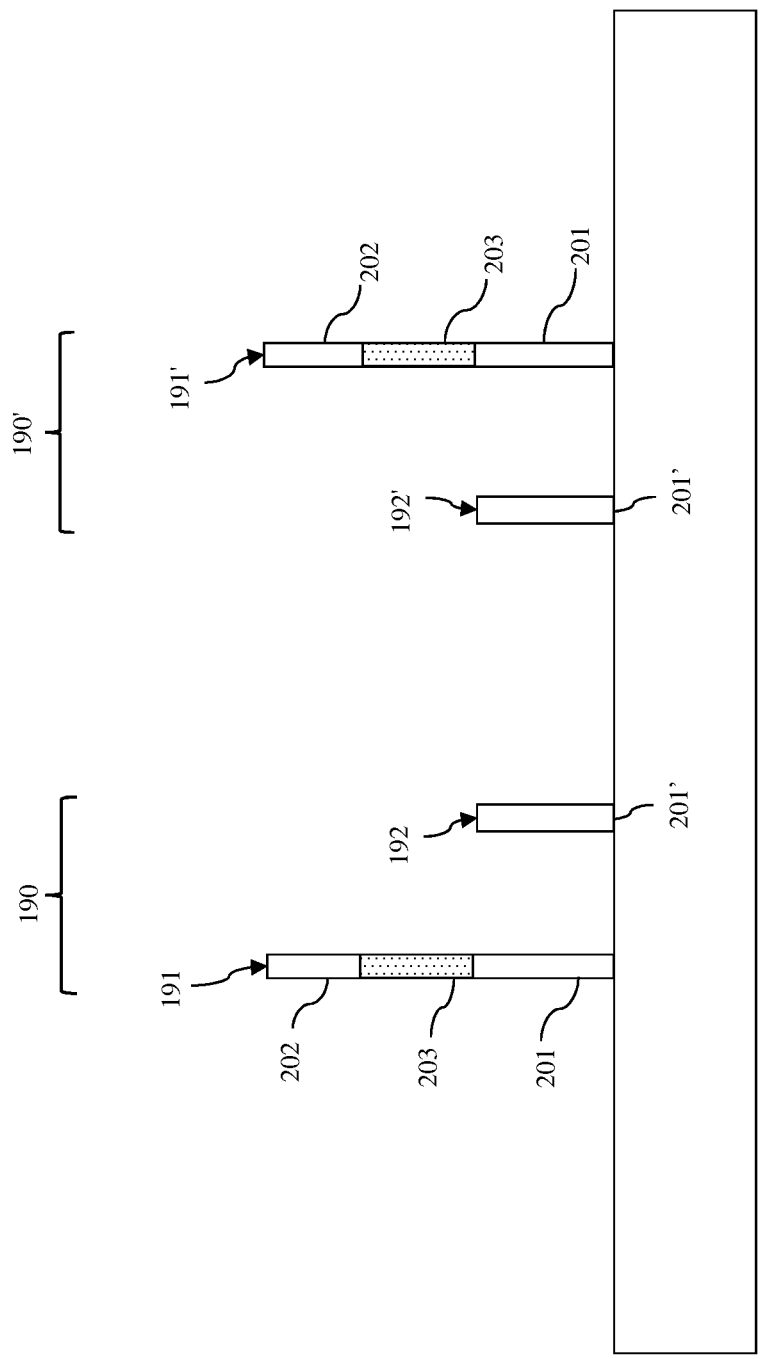
FIG. 11 is a cross-section diagram illustrating a partially completed semiconductor structure formed according to the method of FIG. 7.

After the fin group(s) are formed, a masked etch process can be performed in order to shape the multi-layered fin 191, 191' in each fin group 190, 190' into a tiered multi-layered fin structure and to remove the second semiconductor layer and isolation layer from the additional multi-layered fin 992, 992' (if present) (706). Specifically, the masked etch process 706 can be performed such that the first semiconductor layer 201, 201' in the multi-layered fin 191, 191' is relatively long as compared to both the isolation layer 203, 203' and the second semiconductor layer 202, 202' (i.e., such that the ends (i.e., the first end 223, 223' and the second end 224, 224') of the first semiconductor layer 201, 201' extend laterally beyond ends of the second semiconductor layer 202, 202' and the isolation layer 203, 203'), as shown in FIG. 10. Thus, as a result of the masked etch process 706, each multi-layered fin 191, 191' in each fin group 190,190' becomes a tiered multi-layered fin that has end sections, which have a first height 207, 207', and a center section, which is positioned laterally between the end sections and which has a second height 208, 208' that is greater than the first height 207, 207'. It should be noted that in the case of an SRAM cell, the fin groups 190 and 190' are oppositely oriented. Thus, the first end 223 of the first semiconductor layer 201 of the multi-layered fin 191 and the second end 224' of the first semiconductor layer 201' of the multi-layered fin 191' are on the same side of the SRAM cell (e.g., see top of FIG. 1) and the first end 223' of the first semiconductor layer 201' of the multi-layered fin 191' and the second end 224 of the first semiconductor layer 201 of the multi-layered fin 191 are on the same side of the SRAM cell (e.g., see bottom of FIG. 1). Additionally, this masked etch process 706 can be performed so as to remove the second semiconductor layer and isolation layer from the additional multi-layered fin(s) 992, 992' and expose the top surface of the first semiconductor layer below, thereby forming second fin(s) 192, 192', each second fin being a single-layer fin that is parallel to and shorter than the tiered multi-layered fin 191, 191' (see FIG. 11).

Figure 12:
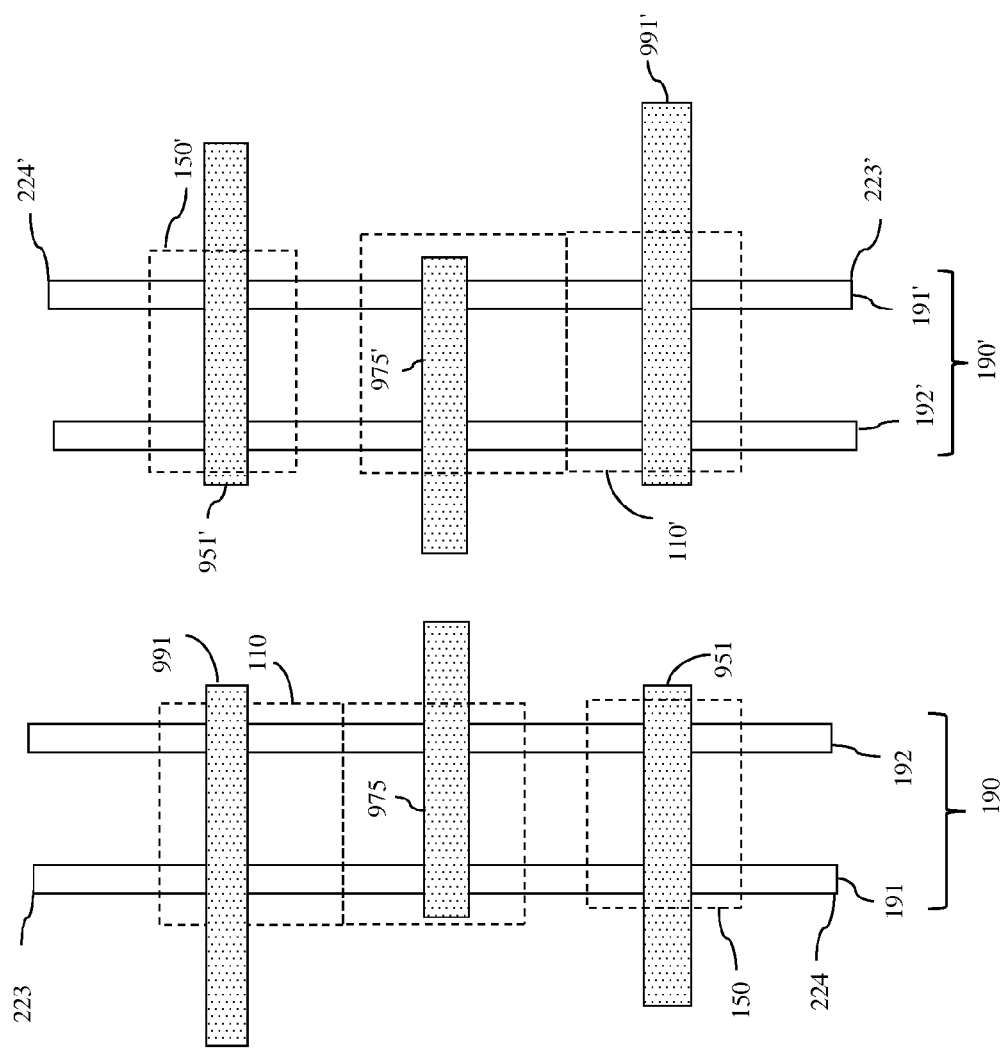
FIG. 12 is top view diagram illustrating a partially completed semiconductor structure formed according to the method of FIG. 7.

Multiple gates can then be formed on each fin group (708). The gates formed at process 708 can be conventional gate-first structures that include, for example, a gate dielectric layer and a polysilicon gate conductor layer. In this case, the gates formed at process 708 will be the functional gates used in the final semiconductor structure. Alternatively, the gates formed at process 708 can be dummy gates (also referred to herein as sacrificial gates) that will be used as placeholders for gate-last structures (e.g., replacement metal gate (RMG) structures) that will be formed during subsequent processing. For purposes of illustration, the method is described in greater detail below and illustrated in the Figures with respect to the formation of dummy gates at process 708. To form such dummy gates at process 708, a blanket layer of a dummy gate material (e.g., a semiconductor material, such as silicon, polysilicon, or amorphous silicon, or any other suitable dummy gate material) can be deposited over each fin group 190, 190' and multiple dielectric cap layers (e.g., a silicon nitride cap layer and a silicon dioxide cap layer) can be deposited on the dummy gate material in order to form a dummy gate stack. This dummy gate stack can then be lithographically patterned and etched to form the multiple dummy gates, as shown in FIG. 12, including: a first dummy gate 991, 991' on the first top surface and first opposing sidewalls of the first semiconductor layer 201, 201' adjacent to a first channel region of a first transistor 110, 110' (e.g., an N-type pass-gate transistor) at one end section of the multi-layered fin 191, 191'; a second dummy gate 975, 975' having a lower portion on the first opposing sides of the first semiconductor layer 201, 201' adjacent to a second channel region of a second transistor 120, 120' (e.g., an N-type pull-down transistor) at a lower level of a center section of the multi-layered fin 191, 191' and having an upper portion on second opposing sides and a second top surface of the second semiconductor layer 202, 202' adjacent to a third channel region of a third transistor 130, 130' (e.g., a P-type pull-up transistor) at an upper level of a center section of the multi-layered fin 191, 191'; and a third dummy gate 951, 951' on the first top surface and first opposing sidewalls of the first semiconductor layer 201, 201' adjacent to a fourth channel region of a fourth transistor 150, 150' (e.g., an N-type footer transistor) at an opposite end section of the multi-layered fin 191, 191'. It should be noted that, if second fin(s) 192, 192' were previously formed, then, depending upon the desired configuration (e.g., 1:1:2, 1:2:2, 1:1:3, etc.), the second dummy gate and, optionally, the first dummy gate and/or the third dummy gate can further be formed such that they extend laterally over the second fin(s) 192, 192' and, particularly, over additional channel regions within the second fin(s).

Following process 708, additional processing can be performed to form the a first source region and a first drain region for the first transistor 110, 110', a second source region and a second drain region for the second transistor 120, 120', a third source region and a third drain region for the third transistor 130, 130' and a fourth source region and a fourth drain region for the fourth transistor 150, 150' in the multi-layered fin 191, 191' of each fin group 190, 190' (710). Various different processing techniques can be used to form the above-mentioned source and drain regions.

Figure 13:
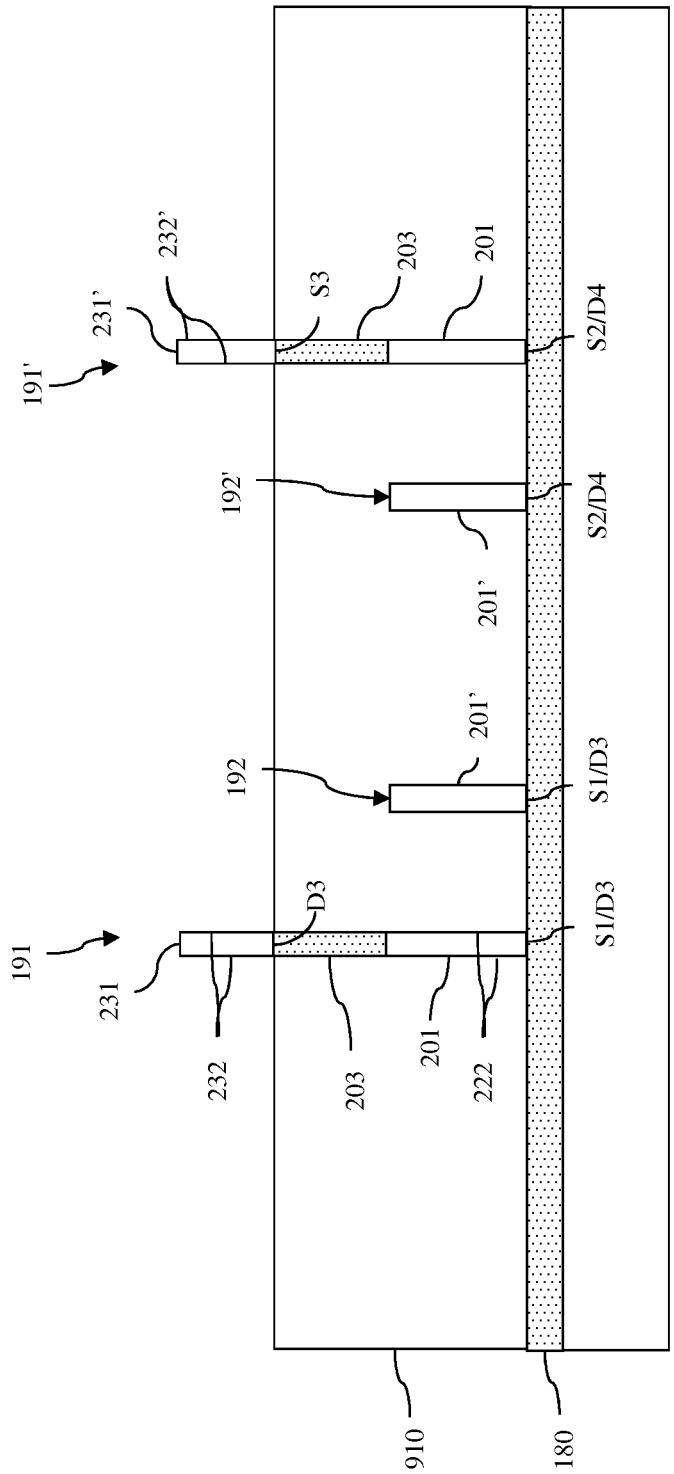
FIG. 13 is a cross-section diagram illustrating a partially completed semiconductor structure formed according to the method of FIG. 7.
Figure 14:
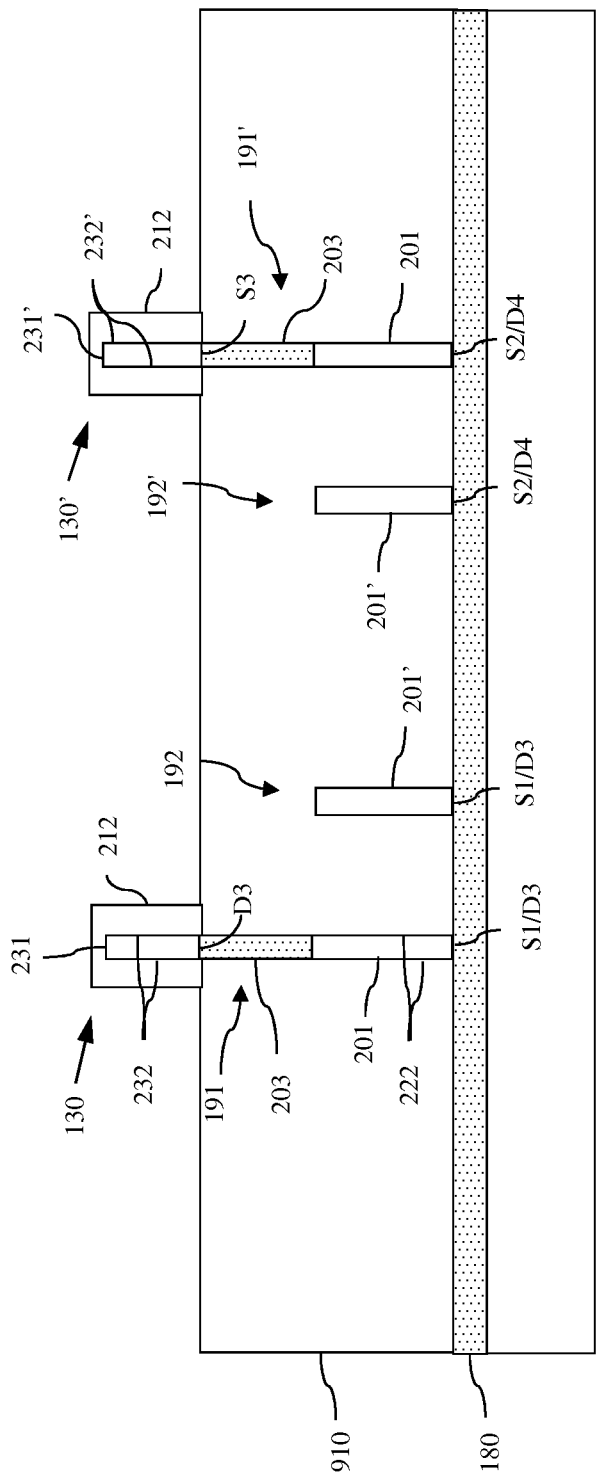
FIG. 14 is a cross-section diagram illustrating a partially completed semiconductor structure formed according to the method of FIG. 7.
Figure 15:
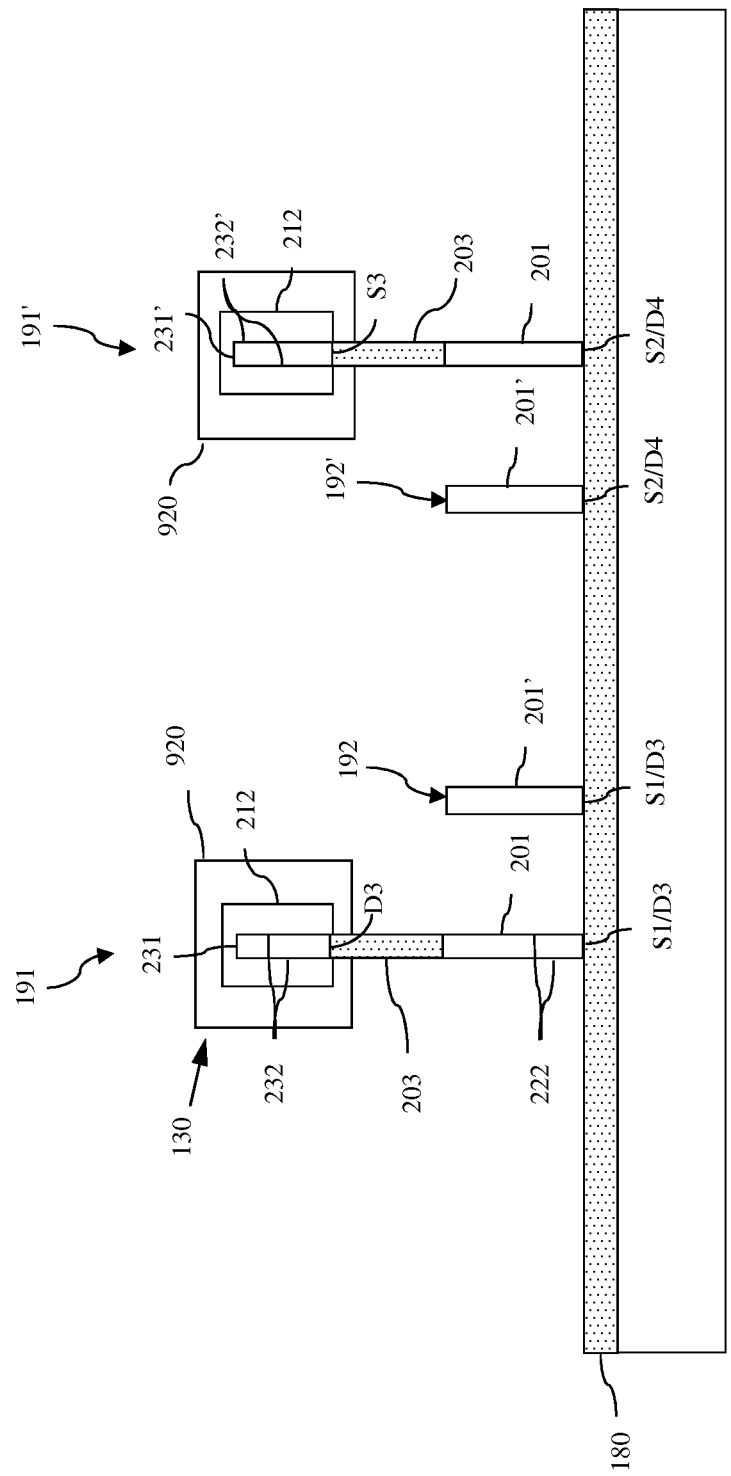
FIG. 15 is a cross-section diagram illustrating a partially completed semiconductor structure formed according to the method of FIG. 7.
Figure 16:
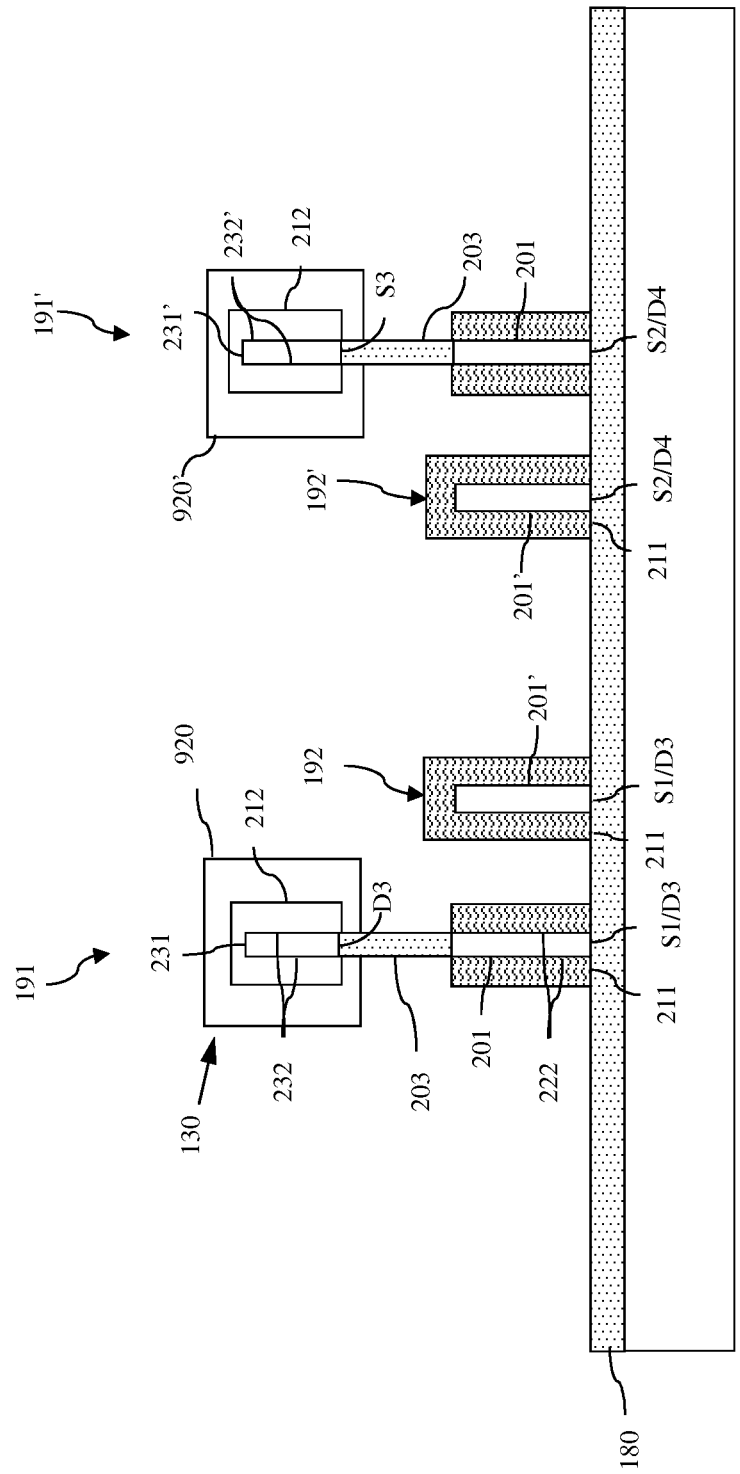
FIG. 16 is a cross-section diagram illustrating a partially completed semiconductor structure formed according to the method of FIG. 7.

For example, a blanket protective layer 910 can be deposited and etched back so that the first semiconductor layer 201, 201' remains protected (see FIG. 13). Then, a dopant implantation process can then be performed in order to form dopant implant regions having the second type conductivity at a relatively high conductivity level (e.g., P+ dopant implant regions) for the third source region (S3) and third drain region (D3) of the third transistor 130, 130' (e.g., of the P-type pull-up transistor) in the exposed portions of the second semiconductor layer 202, 202' on either side of the second dummy gate 975, 975'. Optionally, an epitaxial source/drain layer 212, 212' having the second type conductivity at a relatively high conductivity level (e.g., a P-type epitaxial source/drain layer) can be deposited onto the second top surface 231, 231' and second opposing sides 232, 232' of the second semiconductor layer 202, 202' at the third source region (S3) and third drain region (D3) of the third transistor 130, 130' (see FIG. 14). The blanket protective layer 910 can then be selectively removed and additional protective layers 920, 920' can be formed that protect the second semiconductor layer 202, 202' and, if applicable, the epitaxial source/drain layer 212, 212', leaving the first semiconductor layer 201, 202' of the multi-layered fin 191, 191' and the second fin(s) 192, 192' (if present) exposed (see FIG. 15). Then, another dopant implantation process can be performed in order to form dopant implant regions having the first type conductivity at a relatively high conductivity level (e.g., N+ dopant implant regions) for the following source and drain regions: for the first source region (S1) and first drain region (D1) of the first transistor 110, 110' (e.g., of the N-type pass-gate transistor) in the exposed portions of the first semiconductor layer 201, 201' in the multi-layered fin 191, 191' and the second fin(s) 192, 192' (if present) on either side of the first dummy gate 911, 911'; for the second source region (S2) and second drain region (D2) of the second transistor 120, 120' (e.g., of the N-type pull-up transistor) in the exposed portions of the first semiconductor layer 201, 201' in the multi-layered fin 191, 191' and the second fin(s) 192, 192' (if present) on either side of the second dummy gate 975, 975'; and for the fourth source region (S4) and fourth drain region (D4) of the fourth transistor 150, 150' (e.g., of the N-type footer transistor) in the exposed portions of the first semiconductor layer 201, 201' in the multi-layered fin 191, 191' and the second fin(s) 192, 192' (if present) on either side of the third dummy gate 951, 951'. Optionally, an epitaxial source/drain layer 211, 211' having the first type conductivity at a relatively high conductivity level (e.g., an N-type epitaxial source/drain layer) can be deposited onto the first opposing sides 222, 222' of the first semiconductor layer 201, 201' of the multi-layered fin 191, 191' and onto the top surface and opposing sides of the second fin(s) 192, 192' (if present) adjacent to at the first source region (S1) and first drain region (D1) of the first transistor 110, 110', the second source region (S2) and second drain region (D2) of the second transistor 120, 120' and the fourth source region (S4) and fourth drain region (D4) of the fourth transistor (see FIG. 16). The protective layers 920, 920' can then be selectively removed. It should be noted that the epitaxial source/drain layer 211, 211' and the epitaxial source/drain layer 212, 212' could be the same semiconductor material (e.g., silicon). Alternatively, these epitaxial source/drain layers can be different types of semiconductor materials selected to optimize the performance of NFETs and PFETs, respectively. For example, if the active regions in the first semiconductor layer 201, 201' are for NFETs, the first epitaxial source/drain layer 211, 211' on the first semiconductor layer 201, 201' can be a silicon carbide layer, whereas if the active region(s) in the second semiconductor layer 202, 202' are for PFET(s), then the second epitaxial source/drain layer 212, 212' on the second semiconductor layer 202, 202' can be a silicon germanium layer.

Following process 710, additional processes can be performed in order to complete the semiconductor structure 100, as shown in FIGS. 1-6. Specifically, interlayer dielectric (ILD) material 185 may be deposited (712). For example, one or more layers of any of the following ILD material can be deposited: borophosphosilicate glass (BPSG), phosphosilicate glass (PSG), boron silicate glass (BSG), undoped silicate glass (USG), or any other suitable interlayer dielectric material. If the gates formed at process 708 are dummy gates, then the ILD material can be planarized to expose the top surface of the first dummy gate 911, 911', the second dummy gate 975, 957' and the third dummy gate 951, 951 and these dummy gates can be selectively removed and replaced with a first gate 111, 111', a second gate 175, 175' and a third gate 151, 151', as described in detail above (714). Various different techniques for removing dummy gates and replacing them with replacement gates (e.g., replacement metal gates (RMG)) are well known and, thus, the details of such techniques are omitted from this specification in order to allow the reader to focus on the salient aspects of the disclosed method. Next, additional ILD material can be deposited. Then, conventional back end of the line (BEOL) processing (e.g., damascene and dual damascene processing) can be performed in order to form the various contacts (e.g., see first contact 101, 101'; second contact 140, 140'; third contact 155, 155'; and fourth contact 157, 157') that extend vertically through the ILD material 185 to each multi-layered fin 191, 191' and that, except for the third contact 155, 155', also extend laterally over the second fin(s) 192, 192' (if present) (716). This BEOL processing can further be performed in order to form various local interconnects. For example, in the case of an SRAM cell, a local interconnect 102, 102' can be formed that electrically connects the first gate 111, 111' of the first transistor 110, 110' (e.g., the N-type pass-gate transistor) to a wordline (WL). Additionally, a local interconnect 141 can be formed that electrically connects the second contact 140 (i.e., the shared contact) on the first fin group 190 to the second gate 175' (i.e., the shared gate) on the second fin group 190' and another local interconnect 141' can be formed that electrically connects the second contact 140' (i.e., the shared contact) on the second fin group 190' to the second gate 175 (i.e., the shared gate) on the first fin group 190, thereby forming the cross-coupled inverters of the SRAM cell. Yet another local interconnect 156, 156' can be formed that electrically connects the third contact 155, 155' to the third gate 151, 151' of the fourth transistor 150, 150'.

It should be understood that the method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Those skilled in the art will recognize that different dopants can be used to achieve different type conductivities in different semiconductor materials. For example, P-type conductivity can be achieved in silicon-based semiconductor materials through the use of a Group III dopant, such as boron (B) or indium (In), and N-type conductivity can be achieved in silicon-based semiconductors through the use of a Group V dopant, such as arsenic (As), phosphorous (P) or antimony (Sb). Additionally, those skilled in the art will recognize that the different conductivity levels can be achieved by varying the concentration of the dopant. That is, a higher conductivity level can be achieved with a higher concentration of dopant and vice versa.

Finally, it should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are semiconductor structures. Each semiconductor structure can have non-planar multi-gate field effect transistors (MUGFETs) with different type conductivities in different levels, respectively, of the same multi-layered fin, wherein the number of MUGFETs in each level is different. Specifically, in each semiconductor structure, a fin can have two semiconductor layers and an isolation layer stacked between the semiconductor layers. The first semiconductor layer can have source, drain and channel regions for both a first transistor and a second transistor. The second semiconductor layer can have source, drain and channel regions for a third transistor, which has a different type of conductivity than the first and second transistors. A first gate can be adjacent to the top surface and opposing sides of the first semiconductor layer at the channel region of the first transistor. A second gate can have a lower portion adjacent to the opposing sides only of the first semiconductor layer at the channel region of the second transistor and an upper portion adjacent to the top surface and opposing sides of the second semiconductor layer at the channel region of the third transistor. One such semiconductor structure can be a static random access memory (SRAM) cell, wherein the first, second and third transistors are pass-gate, pull-down and pull-up transistors, respectively. Also disclosed above are methods of forming the semiconductor structures.

What is claimed is:
1. A semiconductor structure comprising:
   a fin comprising:
      a first semiconductor layer having a first top surface and first opposing sides and comprising, for a first transistor, a first drain region, a first channel region and a first source region and, for a second transistor, a second drain region immediately adjacent to the first source region, a second channel region and a second source region;
      an isolation layer on the first top surface above the second transistor; and,
      a second semiconductor layer on the isolation layer, having a second top surface and second opposing sides and comprising, for a third transistor, a third drain region aligned above the second drain region, a third channel region aligned above the second channel region, and a third source region aligned above the second source region;

a first gate adjacent to the first top surface and the first opposing sides at the first channel region; and, a second gate adjacent to the first opposing sides at the second channel region and adjacent to the second top surface and the second opposing sides at the third channel region.

2. The semiconductor structure of claim 1, the first transistor and the second transistor comprising N-type field effect transistors and the third transistor comprising a P-type field effect transistor, the first semiconductor layer having a first end and a second end opposite the first end, the first drain region being within the first semiconductor layer at the first end, the second end being electrically connected to ground, and the second semiconductor layer being electrically connected to a positive supply voltage at the third source region.

3. The semiconductor structure of claim 2, the first semiconductor layer further comprising, for a fourth transistor, a fourth drain region immediately adjacent to the second source region, a fourth channel region, and a fourth source region at the second end, the semiconductor structure further comprising a third gate adjacent to the first top surface and the first opposing sides at the fourth channel region, and the third gate being electrically connected to the positive supply voltage.

4. The semiconductor structure of claim 1, further comprising a first epitaxial source/drain layer adjacent to the first semiconductor layer at the first drain region, the first source region, the second drain region and the second source region and a second epitaxial source/drain layer adjacent to the second semiconductor layer at the third drain region and the third source region.

5. The semiconductor structure of claim 1, further comprising a shared contact electrically connecting the first source region and the second drain region to the third drain region.

6. The semiconductor structure of claim 5, further comprising a second fin parallel to and shorter than the fin, the second fin comprising a single semiconductor layer and the second gate and the shared contact each extending laterally over the second fin.

7. The semiconductor structure of claim 6, the first gate further extending laterally over the second fin.

8. A semiconductor structure comprising:

two fin groups, each fin group comprising at least one fin comprising:

a first semiconductor layer having a first top surface and first opposing sides and comprising, for a pass-gate transistor, a first drain region, a first channel region and a first source region and, for a pull-down transistor, a second drain region immediately adjacent to the first source region, a second channel region and a second source region;

an isolation layer on the first top surface above the pull-down transistor; and, a second semiconductor layer on the isolation layer, having a second top surface and second opposing sides and comprising, for a pull-up transistor, a third drain region aligned above the second drain region, a third channel region aligned above the second channel region, and a third source region aligned above the second source region, the fin groups being oppositely oriented;

first gates on the two fin groups, respectively, each first gate being adjacent to the first top surface and the first opposing sides at the first channel region;

second gates on the two fin groups, respectively, the second gates being in end-to-end alignment and each second gate being adjacent to the first opposing sides at the second channel region and adjacent to the second top surface and the second opposing sides at the third channel region;

shared contacts on the two fin groups, respectively, each shared contact electrically connecting the first source region of the pass-gate transistor and the second drain region of the pull-down transistor to the third drain region of the pull-up transistor; and, local interconnects, each local interconnect electrically connecting a second gate on one fin group to a shared contact on another fin group.

9. The semiconductor structure of claim 8, the first semiconductor layer having a first end and a second end opposite the first end, the first drain region being within the first semiconductor layer at the first end, the second end being electrically connected to ground, and the second semiconductor layer being electrically connected to a positive supply voltage at the third source region.

10. The semiconductor structure of claim 9, the first semiconductor layer further comprising, for a fourth transistor, a fourth drain region immediately adjacent to the second source region, a fourth channel region, and a fourth source region at the second end, and the semiconductor structure further comprising third gates on the two fin groups, respectively, each third gate being adjacent to the first top surface and the first opposing sides at the fourth channel region and being electrically connected to the positive supply voltage.

11. The semiconductor structure of claim 8, the at least one fin further comprising a first epitaxial source/drain layer adjacent to the first semiconductor layer at the first drain region, the first source region, the second drain region and the second source region and a second epitaxial source/drain layer adjacent to the second semiconductor layer at the third drain region and the third source region.

12. The semiconductor structure of claim 8, each first drain region of each pass-gate transistor being electrically connected to a bit line and each first gate of each pass-gate transistor being electrically connected to a word line.

13. The semiconductor structure of claim 8, each fin group further comprising a second fin parallel to and shorter than the fin, the second fin comprising a single semiconductor layer, each second gate and each shared contact on each fin group extending laterally over the second fin.

14. The semiconductor structure of claim 13, each first gate on each fin group further extending laterally over the second fin.

15. A method of forming a semiconductor structure, the method comprising:

forming a fin comprising:

a first semiconductor layer having a first top surface and first opposing sides and comprising, for a first transistor, a first drain region, a first channel region and a first source region and, for a second transistor, a second drain region immediately adjacent to the first source region, a second channel region and a second source region;

an isolation layer on the first top surface above the second transistor; and, a second semiconductor layer on the isolation layer, having a second top surface and second opposing sides and comprising, for a third transistor, a third drain region aligned above the second drain region, a third channel region aligned above the second channel region, and a third source region aligned above the second source region; and, forming multiple gates on the fin, the multiple gates comprising: a first gate adjacent to the first top surface and the first opposing sides at the first channel region; and, a second gate adjacent to the first opposing sides at the second channel region and adjacent to the second top surface and the second opposing sides at the third channel region.

16. The method of claim 15, the first transistor and the second transistor being formed so as to comprise N-type field effect transistors and the third transistor being formed so as to comprise a P-type field effect transistor, the first semiconductor layer having a first end and a second end opposite the first end, the first drain region being within the first semiconductor layer at the first end, the method further comprising electrically connecting the second end to ground and electrically connecting the second semiconductor layer to a positive supply voltage at the third source region.

17. The method of claim 16, the first semiconductor layer further comprising, for a fourth transistor, a fourth drain region immediately adjacent to the second source region, a fourth channel region, and a fourth source region at the second end, the multiple gates further comprising a third gate adjacent to the first top surface and the first opposing sides at the fourth channel region, and the method further comprising electrically connecting the third gate to the positive supply voltage.

18. The method of claim 15, the forming of the fin further comprising:

forming a first epitaxial source/drain layer adjacent to the first semiconductor layer at the first drain region, the first source region, the second drain region and the second source region; and forming a second epitaxial source/drain layer adjacent to the second semiconductor layer at the third drain region and the third source region.

19. The method of claim 15, further comprising forming a shared contact that electrically connects the first source region and the second drain region to the third drain region.

20. The method of claim 15, further comprising, during the forming of the fin, forming a second fin parallel to and shorter than the fin, the second fin comprising a third semiconductor layer having a third top surface that is approximately level with the first top surface, the second gate and the shared contact each extending laterally over the second fin.

* * * * *